US011978690B2

(12) United States Patent
Mukundan et al.

(10) Patent No.: US 11,978,690 B2
(45) Date of Patent: May 7, 2024

(54) ANCHOR AND CAVITY CONFIGURATION FOR MEMS-BASED COOLING SYSTEMS

(71) Applicant: Frore Systems Inc., San Jose, CA (US)

(72) Inventors: Vikram Mukundan, San Ramon, CA (US); Suryaprakash Ganti, Los Altos, CA (US); Seshagiri Rao Madhavapeddy, La Jolla, CA (US); Ananth Saran Yalamarthy, Stanford, CA (US); Prathima Kapa, Dublin, CA (US)

(73) Assignee: Frore Systems Inc., San Jose, CA (US)

( * ) Notice: Subject to any disclaimer, the term of this patent is extended or adjusted under 35 U.S.C. 154(b) by 61 days.

(21) Appl. No.: 17/860,561

(22) Filed: Jul. 8, 2022

(65) Prior Publication Data

US 2023/0030322 A1 Feb. 2, 2023

Related U.S. Application Data

(60) Provisional application No. 63/353,490, filed on Jun. 17, 2022, provisional application No. 63/220,371, filed on Jul. 9, 2021.

(51) Int. Cl.
*H01L 23/40* (2006.01)
*B81B 3/00* (2006.01)
*G06F 1/20* (2006.01)
*H01L 23/473* (2006.01)

(52) U.S. Cl.
CPC ........ *H01L 23/4735* (2013.01); *B81B 3/0021* (2013.01); *G06F 1/20* (2013.01);
(Continued)

(58) Field of Classification Search
CPC ......... H01L 23/40; H01L 23/42; H01L 23/46; H01L 23/467; H01L 23/4735;
(Continued)

(56) References Cited

U.S. PATENT DOCUMENTS 7,031,155 B2 * 4/2006 Sauciuc ................ H01L 23/467
257/722
7,282,837 B2 10/2007 Scher
(Continued)

*Primary Examiner* — Amir A Jalali
(74) *Attorney, Agent, or Firm* — Van Pelt, Yi & James LLP

(57) ABSTRACT

A cooling system is described. The cooling system includes a bottom plate, a support structure, and a cooling element. The bottom plate has orifices therein. The cooling element has a central axis and is supported by the support structure at the central axis. A first portion of the cooling element is on a first side of the central axis and a second portion of the cooling element is on a second side of the central axis opposite to the first side. The first and second portions of the cooling element are unpinned. The first portion and the second portion are configured to undergo vibrational motion when actuated to drive a fluid toward a heat-generating structure. The support structure couples the cooling element to the bottom plate. At least one of the support structure is an adhesive support structure or the support structure undergoes rotational motion in response to the vibrational motion. The adhesive support structure has at least one lateral dimension defined by a trench in the cooling element or the bottom plate.

19 Claims, 10 Drawing Sheets

(52) U.S. Cl.
CPC ........ *H01L 23/40* (2013.01); *B81B 2201/034* (2013.01); *B81B 2203/0118* (2013.01); *B81B 2203/0307* (2013.01); *B81B 2203/0315* (2013.01); *B81B 2203/033* (2013.01); *B81B 2207/99* (2013.01)

(58) Field of Classification Search
CPC .......... H01L 41/094; H05K 7/14; H05K 7/20; H05K 7/20136; H05K 7/20145; H05K 7/20154; H05K 7/20172; H05K 7/20218; H05K 7/20254; H05K 7/20272; H05K 7/20309; H05K 7/20327; H05K 7/20381; H05K 7/2039; H05K 7/20863; H05K 7/20909; H05K 7/20972; H05K 5/03; H05K 5/0213; G06F 1/20; G06F 1/203; B81B 3/0021; B81B 2201/034; B81B 2203/0118; B81B 2203/0307; B81B 2203/0315; B81B 2203/033; B81B 2207/99; F28F 13/10; F28F 2250/08; F28D 2021/0028; F04B 43/046; F04B 43/095
See application file for complete search history.

(56) References Cited

U.S. PATENT DOCUMENTS

| | | | |
|---|---|---|---|
| 8,721,303 B2 * | 5/2014 | Fujisaki | F04B 43/095 417/413.2 |
| 2005/0089415 A1 | 4/2005 | Cho | |
| 2005/0225213 A1 | 10/2005 | Richards | |
| 2006/0138905 A1 | 6/2006 | Gonzales | |
| 2008/0217764 A1 | 9/2008 | Campini | |
| 2008/0304979 A1 * | 12/2008 | Lucas | F04B 45/04 417/327 |
| 2011/0063800 A1 * | 3/2011 | Park | H01L 23/467 361/697 |
| 2017/0292537 A1 | 10/2017 | Barak | |
| 2019/0101938 A1 * | 4/2019 | Mou | F04B 43/046 |
| 2021/0010467 A1 * | 1/2021 | Fujisaki | F04B 43/046 |
| 2021/0176895 A1 * | 6/2021 | Mukundan | H05K 7/20418 |
| 2021/0180723 A1 | 6/2021 | Mukundan | |
| 2021/0183739 A1 | 6/2021 | Sathyamurthy | |
| 2021/0185853 A1 * | 6/2021 | Ganti | G06F 1/206 |
| 2023/0121697 A1 * | 4/2023 | Bussmann | F04B 49/12 417/413.3 |

* cited by examiner

US 11,978,690 B2

ANCHOR AND CAVITY CONFIGURATION FOR MEMS-BASED COOLING SYSTEMS

CROSS REFERENCE TO OTHER APPLICATIONS

This application claims priority to U.S. Provisional Patent Application No. 63/220,371 entitled MEMS-BASED ACTIVE COOLING SYSTEMS INCLUDING COOLING CELL ARRANGEMENT, TABS, ANCHOR BONDING, INTEGRATED SPREADER, ADHESIVE, AND POWER MANAGEMENT filed Jul. 9, 2021 and U.S. Provisional Patent Application No. 63/353,490 entitled MEMS VIBRATIONAL COOLING SYSTEM HAVING AN INTEGRATED SPOUT AND A GRAPHITE COVER filed Jun. 17, 2022, both of which are incorporated herein by reference for all purposes.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Moreover, incorporating cooling solutions into computing devices may be challenging. Consequently, additional cooling solutions for computing devices are desired.

BRIEF DESCRIPTION OF THE DRAWINGS

Various embodiments of the invention are disclosed in the following detailed description and the accompanying drawings.

DETAILED DESCRIPTION

Figure 1A:
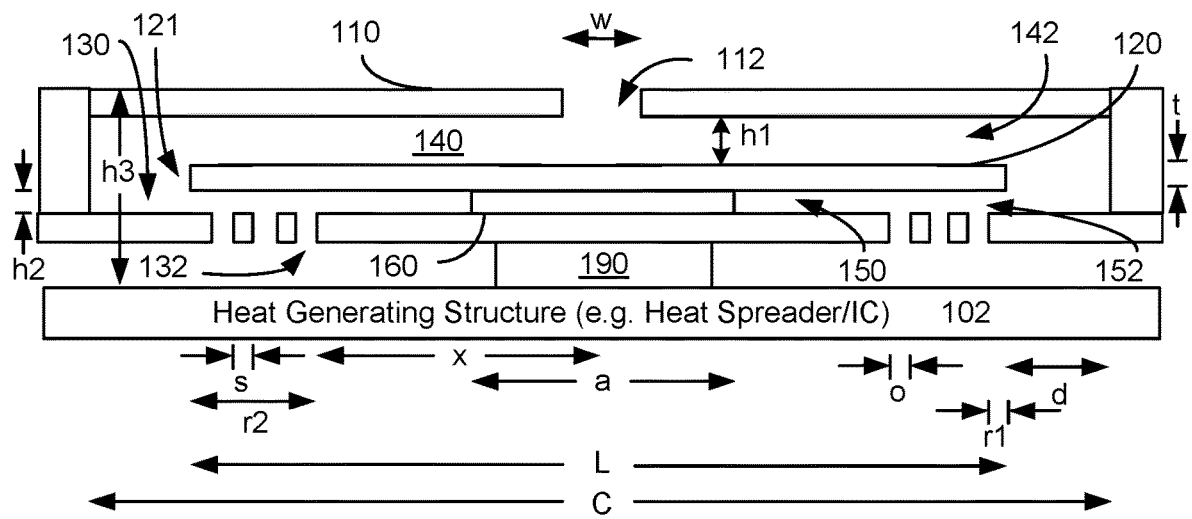
FIGS. 1A-1G depict an embodiment of an active MEMS cooling system including a centrally anchored cooling element.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebook computers, and virtual reality devices as well as for other computing devices such as servers, can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated. Further, other components in a computing device may generate heat. Thus, thermal management is increasingly an issue for computing devices.

Larger computing devices, such as laptop computers, desktop computers, or servers, include active cooling systems. Active cooling systems are those in which an electrical signal is used to drive cooling. An electric fan that has rotating blades is an example of an active cooling system, while a heat sink is an example of a passive cooling system. When energized, the fan's rotating blades drive air through the larger devices to cool internal components. However, space and other limitations in computing devices limit the use of active cooling systems. Fans are typically too large for mobile and/or thinner devices such as smartphones and tablet or notebook computers. Fans also may have limited efficacy because of the boundary layer of air existing at the surface of the components because they provide a limited airspeed for air flow across the hot surface desired to be cooled, and because they may generate an excessive amount of noise. Fans also have a limited backpressure. Space and power limitations may further restrict the ability to provide electrical connection to active cooling systems. For example, if multiple active cooling systems are used, the connections to the active cooling systems may be required to fit within a small area. In addition, the power consumed by such a cooling system may be desired to be small, particularly for mobile devices. Consequently, active cooling systems face particular challenges when used in computing devices such as active computing devices. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions are desired.

A cooling system is described. The cooling system includes a bottom plate, a support structure, and a cooling element. The bottom plate has orifices therein. The cooling element has a central axis and is supported by the support structure at the central axis. A first portion of the cooling element is on a first side of the central axis and a second portion of the cooling element is on a second side of the central axis opposite to the first side. The first and second portions of the cooling element are unpinned. The first portion and the second portion are configured to undergo vibrational motion when actuated to drive a fluid toward a heat-generating structure. The support structure couples the cooling element to the bottom plate. At least one of the support structure is an adhesive support structure or the support structure undergoes rotational motion in response to the vibrational motion. The adhesive support structure has at least one lateral dimension defined by a trench in the cooling element or the bottom plate.

In some embodiments, the cooling element includes a material having a high acoustic velocity and low internal losses. The cooling element may consist of the material. The high acoustic velocity is greater than four thousand meters per second. The low internal losses are not more than 0.1 percent losses. The material may include at least one of Al7075, Al6063, Ti64 (Ti Grade 5), Ti Grade 2, Ti Grade 9, a beryllium-copper alloy, Monel, aluminum bronze, aluminum, SUS304, or SUS316.

In some embodiments, the bottom plate has a thickness, includes a material, and has a cavity therein. The cavity has a depth and a cavity width. The support structure has an anchor width. At least one of the depth, the anchor width, the thickness, or the material is configured to increase the rotational motion of the support structure. In some such embodiments, the cooling element, support structure and bottom plate are part of a cooling cell having a cooling cell width. At least one of the anchor width is not more than two millimeters, the depth of the cavity is at least fifty percent and not more than ninety percent of the thickness, the cavity width is at least one-eighth and not more than three-eighths of the cooling cell width, or the material includes at least one of Al7075, Al6063, Ti64, Ti Grade 2, Ti Grade 9, a beryllium-copper alloy, Monel, aluminum bronze, aluminum, SUS304, or SUS316. The bottom plate may include an orifice plate and a jet channel plate. The orifice plate includes the orifices therein. The jet channel plate includes the cavity therein.

In some embodiments, the support structure is the adhesive support structure. The cooling element may include the trench defining a first support structure width. In such embodiments, the bottom plate may include an additional trench defining a second support structure width. The second support structure width is different from the first support structure width. In some embodiments, the bottom plate or the cooling element further includes a support structure region aligned with and coupled to the support structure. The support structure region has a surface including at least one tortuous path defined thereon. The adhesive support structure has a high Young's modulus of, for example, at least two Gpa and in some embodiments at least ten Gpa. If used as a pedestal, the adhesive may have a low Young's modulus of less than five Mpa, a glass transition temperature of not more than twenty-five degrees Celsius, and/or a thermal conductivity of at least 0.8 W/meter-Kelvin in some embodiments.

In some embodiments the cooling system includes a plurality of cooling cells. Each cell may include the support structure, cooling element and bottom plates described herein. A method of cooling a heat-generating structure is also described. In some embodiments, the method includes driving cooling element(s) in the systems described herein. In some such embodiments, the cooling element(s) are driven at or near resonance.

Figure 1B:
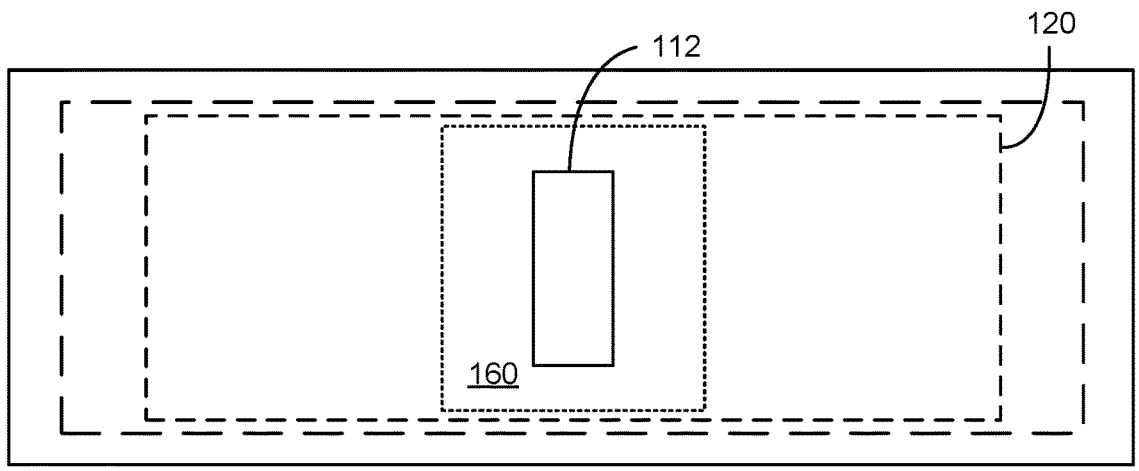
Figure 1C:
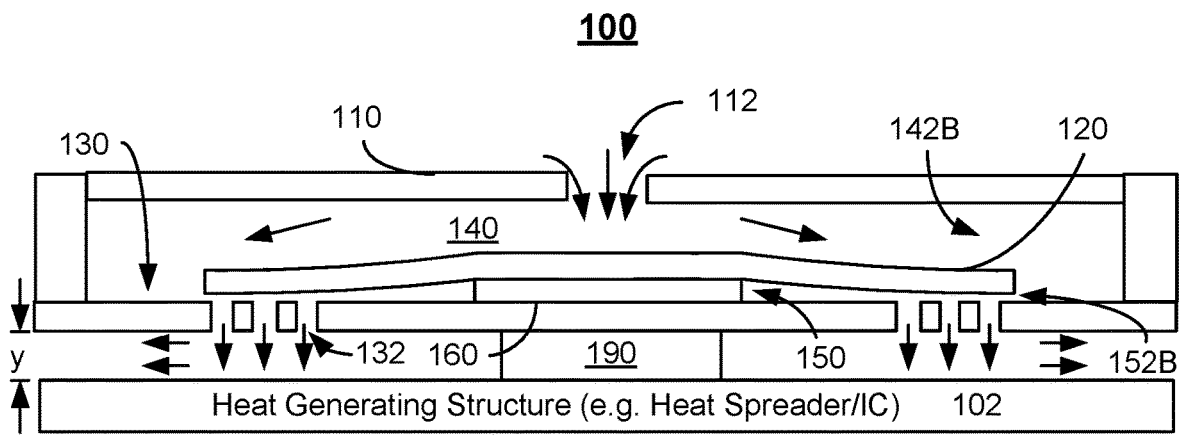
Figure 1D:
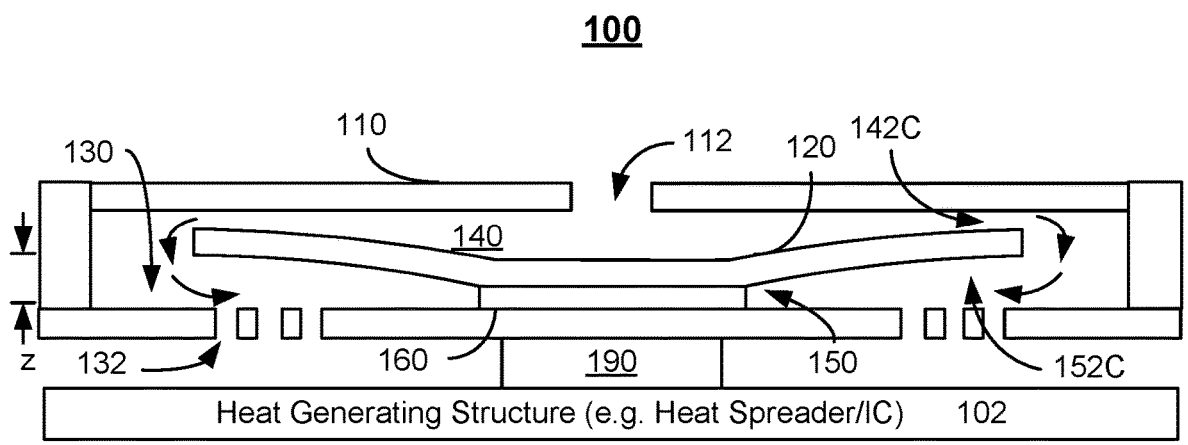
Figure 1E:
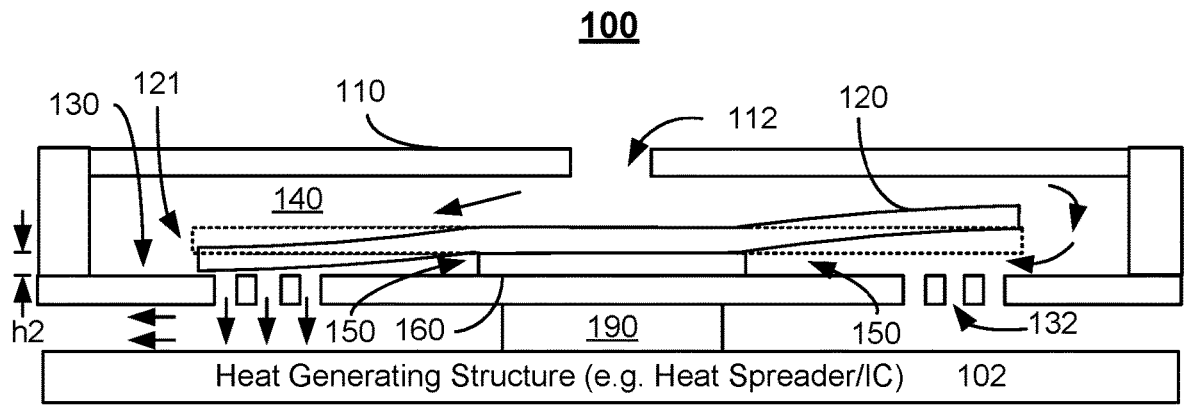
Figure 1F:
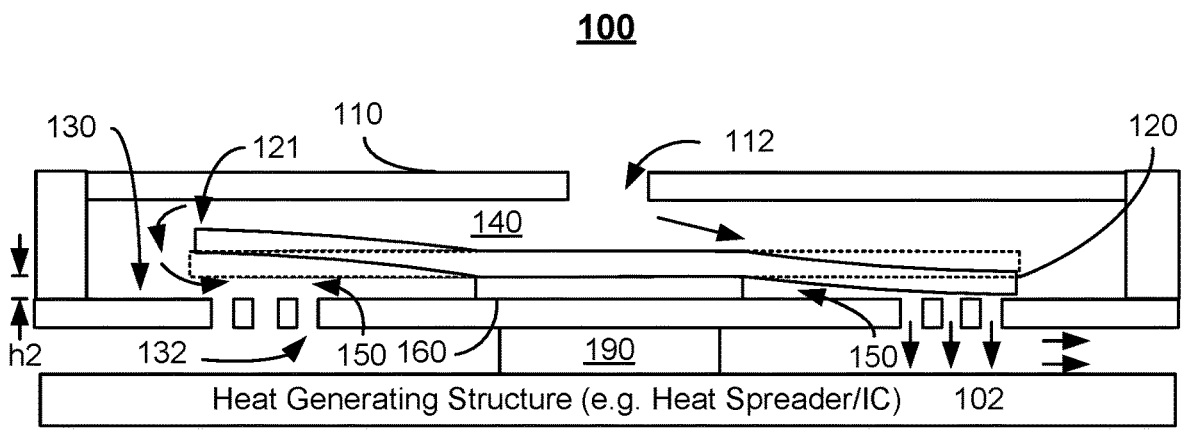
Figure 1G:
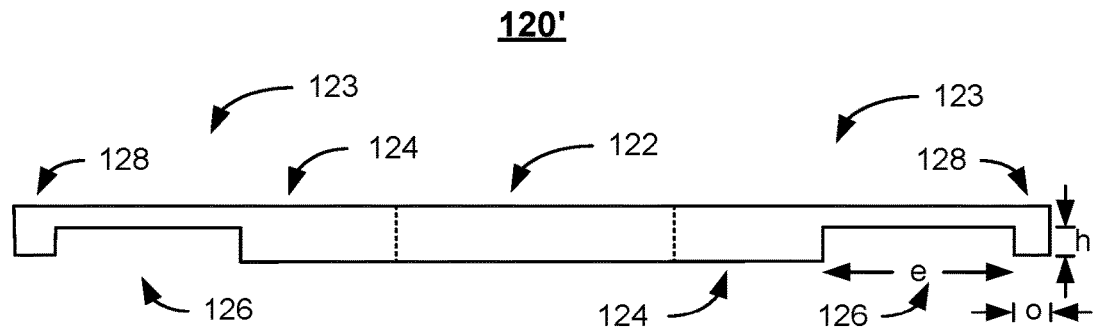

FIGS. 1A-1G are diagrams depicting an exemplary embodiment of active MEMS cooling system 100 usable with heat-generating structure 102 and including a centrally anchored cooling element 120 or 120'. Cooling element 120 is shown in FIGS. 1A-1F and cooling element 120' is shown in FIG. 1G. For clarity, only certain components are shown. FIGS. 1A-1G are not to scale. FIGS. 1A and 1B depict cross-sectional and top views of cooling system 100 in a neutral position. FIGS. 1C-1D depict cooling system 100 during actuation for in-phase vibrational motion. FIGS. 1E-1F depict cooling system 100 during actuation for out-of-phase vibrational motion. Although shown as symmetric, cooling system 100 need not be.

Cooling system 100 includes top plate 110 having vent 112 therein, cooling element 120, orifice plate 130 having orifices 132 therein, support structure (or "anchor") 160 and chambers 140 and 150 (collectively chamber 140/150) formed therein. Cooling element 120 is supported at its central region by anchor 160. Regions of cooling element 120 closer to and including portions of the cooling element's perimeter (e.g. tip 121) vibrate when actuated. In some embodiments, tip 121 of cooling element 120 includes a portion of the perimeter furthest from anchor 160 and undergoes the largest deflection during actuation of cooling element 120. For clarity, only one tip 121 of cooling element 120 is labeled in FIG. 1A. Also shown is pedestal 190 that connects orifice plate 130 to and offsets orifice plate 130 from heat-generating structure 102. In some embodiments, pedestal 190 also thermally couples orifice plate 130 to heat-generating structure 102. In some embodiments, an additional jet channel plate may be present and supported by pedestal 190. Thus orifice plate 130 and/or such a jet channel plate may be part or all of a bottom plate supported by pedestal 190. Thus, multiple plates and/or plate(s) having various structures may be used at the bottom plate for cooling system 100.

FIG. 1A depicts cooling system 100 in a neutral position. Thus, cooling element 120 is shown as substantially flat. For in-phase operation, cooling element 120 is driven to vibrate between positions shown in FIGS. 1C and 1D. This vibrational motion draws fluid (e.g. air) into vent 112, through chambers 140 and 150 and out orifices 132 at high speed and/or flow rates. For example, the speed at which the fluid impinges on heat-generating structure 102 may be at least thirty meters per second. In some embodiments, the fluid is driven by cooling element 120 toward heat-generating structure 102 at a speed of at least forty-five meters per second. In some embodiments, the fluid is driven toward heat-generating structure 102 by cooling element 120 at speeds of at least sixty meters per second. Other speeds may be possible in some embodiments. Cooling system 100 is also configured so that little or no fluid is drawn back into chamber 140/150 through orifices 132 by the vibrational motion of cooling element 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled. In some embodiments, heat-generating structure 102 may be a thermally conductive part of a module containing cooling system 100. For example, cooling system 100 may be affixed to heat-generating structure 102, which may be coupled to another heat sink, vapor chamber, integrated circuit, or other separate structure desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electromechanical system (MEMS) cooling system capable of residing within mobile computing devices and/or other devices having limited space in at least one dimension. For example, the total height, h3, of cooling system 100 (from the top of heat-generating structure 102 to the top of top plate 110) may be less than 2 millimeters. In some embodiments, the total height of cooling system 100 is not more than 1.5 millimeters. In some embodiments, this total height is not more than 1.1 millimeters. In some embodiments, the total height does not exceed one millimeter. In some embodiments, the total height does not exceed two hundred and fifty micrometers. Similarly, the distance between the bottom of orifice plate 130 and the top of heat-generating structure 102, y, may be small. In some embodiments, y is at least two hundred micrometers and not more than 1.2 millimeter. For example, y may be at least two hundred and fifty micrometers and not more than three hundred micrometers. In some embodiments, y is at least five hundred micrometers and not more than one millimeter. In some embodiments, y is at least two hundred micrometers and not more than three hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system 100 resides (e.g. in an enclosed device).

Cooling element 120 can be considered to divide the interior of active MEMS cooling system 100 into top chamber 140 and bottom chamber 150. Top chamber 140 is formed by cooling element 120, the sides, and top plate 110. Bottom chamber 150 is formed by orifice plate 130, the sides, cooling element 120 and anchor 160. Top chamber 140 and bottom chamber 150 are connected at the periphery of cooling element 120 and together form chamber 140/150 (e.g. an interior chamber of cooling system 100).

The size and configuration of top chamber 140 may be a function of the cell (cooling system 100) dimensions, cooling element 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that cooling element 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Bottom chamber 150 has a height, h2. In some embodiments, the height of bottom chamber 150 is sufficient to accommodate the motion of cooling element 120. Thus, no portion of cooling element 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of cooling element 120 plus at least five micrometers and not more than ten micrometers. In some embodiments, the deflection of cooling element 120 (e.g. the deflection of tip 121), z, has an amplitude of at least ten micrometers and not more than one hundred micrometers. In some such embodiments, the amplitude of deflection of cooling element 120 is at least ten micrometers and not more than sixty micrometers. However, the amplitude of deflection of cooling element 120 depends on factors such as the desired flow rate through cooling system 100 and the configuration of cooling system 100. Thus, the height of bottom chamber 150 generally depends on the flow rate through and other components of cooling system 100.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. Although top plate 110 is shown as substantially flat, in some embodiments trenches and/or other structures may be provided in top plate 110 to modify the configuration of top chamber 140 and/or the region above top plate 110.

Anchor (support structure) 160 supports cooling element 120 at the central portion of cooling element 120. Thus, at least part of the perimeter of cooling element 120 is unpinned and free to vibrate. In some embodiments, anchor 160 extends along a central axis of cooling element 120 (e.g. perpendicular to the page in FIGS. 1A-1F). In such embodiments, portions of cooling element 120 that vibrate (e.g. including tip 121) move in a cantilevered fashion. Thus, portions of cooling element 120 may move in a manner analogous to the wings of a butterfly (i.e. in phase) and/or analogous to a seesaw (i.e. out of phase). Thus, the portions of cooling element 120 that vibrate in a cantilevered fashion do so in phase in some embodiments and out of phase in other embodiments. In some embodiments, anchor 160 does not extend along an axis of cooling element 120. In such embodiments, all portions of the perimeter of cooling element 120 are free to vibrate (e.g. analogous to a jellyfish). In the embodiment shown, anchor 160 supports cooling element 120 from the bottom of cooling element 120. In other embodiments, anchor 160 may support cooling element 120 in another manner. For example, anchor 160 may support cooling element 120 from the top (e.g. cooling element 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of cooling element 120.

Cooling element 120 has a first side distal from heat-generating structure 102 and a second side proximate to heat-generating structure 102. In the embodiment shown in FIGS. 1A-1F, the first side of cooling element 120 is the top of cooling element 120 (closer to top plate 110) and the second side is the bottom of cooling element 120 (closer to orifice plate 130). Cooling element 120 is actuated to undergo vibrational motion as shown in FIGS. 1A-1F. The vibrational motion of cooling element 120 drives fluid from the first side of cooling element 120 distal from heat-generating structure 102 (e.g. from top chamber 140) to a second side of cooling element 120 proximate to heat-generating structure 102 (e.g. to bottom chamber 150). The vibrational motion of cooling element 120 also draws fluid through vent 112 and into top chamber 140; forces fluid from top chamber 140 to bottom chamber 150; and drives fluid from bottom chamber 150 through orifices 132 of orifice plate 130. Thus, cooling element 120 may be viewed as an actuator. Although described in the context of a single, continuous cooling element, in some embodiments, cooling element 120 may be formed by two (or more) cooling elements. Each of the cooling elements is depicted as one portion pinned (e.g. supported by support structure 160) and an opposite portion unpinned. Thus, a single, centrally supported cooling element 120 may be formed by a combination of multiple cooling elements supported at an edge.

Cooling element 120 has a length, L, that depends upon the frequency at which cooling element 120 is desired to vibrate. In some embodiments, the length of cooling element 120 is at least four millimeters and not more than ten millimeters. In some such embodiments, cooling element 120 has a length of at least six millimeters and not more than eight millimeters. The depth of cooling element 120 (e.g. perpendicular to the plane shown in FIGS. 1A-1F) may vary from one fourth of L through twice L. For example, cooling element 120 may have the same depth as length. The thickness, t, of cooling element 120 may vary based upon the configuration of cooling element 120 and/or the frequency at which cooling element 120 is desired to be actuated. In some embodiments, the cooling element thickness is at least two hundred micrometers and not more than three hundred and fifty micrometers for cooling element 120 having a length of eight millimeters and driven at a frequency of at least twenty kilohertz and not more than twenty-five kilohertz. The length, C, of chamber 140/150 is close to the length, L, of cooling element 120. For example, in some embodiments, the distance, d, between the edge of cooling element 120 and the wall of chamber 140/150 is at least one hundred micrometers and not more than five hundred micrometers. In some embodiments, d is at least two hundred micrometers and not more than three hundred micrometers.

Cooling element 120 may be driven at a frequency that is at or near both the resonant frequency for an acoustic resonance of a pressure wave of the fluid in top chamber 140 and the resonant frequency for a structural resonance of cooling element 120. The portion of cooling element 120 undergoing vibrational motion is driven at or near resonance (the "structural resonance") of cooling element 120. This portion of cooling element 120 undergoing vibration may be a cantilevered section in some embodiments. The frequency of vibration for structural resonance is termed the structural resonant frequency. Use of the structural resonant frequency in driving cooling element 120 reduces the power consumption of cooling system 100. Cooling element 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of cooling element 120 and near the connection between top chamber 140 and bottom chamber 150). The distance between these two regions is C/2. Thus, C/2=nλ/4, where λ is the acoustic wavelength for the fluid and n is odd (e.g. n=1, 3, 5, etc.). For the lowest order mode, C=λ/2. Because the length of chamber 140 (e.g. C) is close to the length of cooling element 120, in some embodiments, it is also approximately true that L/2=nλ/4, where λ is the acoustic wavelength for the fluid and n is odd. Thus, the frequency at which cooling element 120 is driven, ν, is at or near the structural resonant frequency for cooling element 120. The frequency ν is also at or near the acoustic resonant frequency for at least top chamber 140. The acoustic resonant frequency of top chamber 140 generally varies less dramatically with parameters such as temperature and size than the structural resonant frequency of cooling element 120. Consequently, in some embodiments, cooling element 120 may be driven at (or closer to) a structural resonant frequency rather than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of cooling element 120 (tip 121 moves away from orifice plate 130) that would pull fluid into bottom chamber 150 through orifices 132 is reduced. The locations of orifices are also desired to be sufficiently close to tip 121 that suction in the upstroke of cooling element 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of cooling element 120. In some embodiments, r1 is at least one hundred micrometers (e.g. r1≥100 μm) and r2 is not more than one millimeter (e.g. r2≤1000 μm). In some embodiments, orifices 132 are at least two hundred micrometers from tip 121 of cooling element 120 (e.g. r1≥200 μm). In some such embodiments, orifices 132 are at least three hundred micrometers from tip 121 of cooling element 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling element 120 is actuated using a piezoelectric. Thus, cooling element 120 may be a piezoelectric cooling element. Cooling element 120 may be driven by a piezoelectric that is mounted on or integrated into cooling element 120. In some embodiments, cooling element 120 is driven in another manner including but not limited to providing a piezoelectric on another structure in cooling system 100. Cooling element 120 and analogous cooling elements are referred to hereinafter as piezoelectric cooling elements though it is possible that a mechanism other than a piezoelectric might be used to drive the cooling element. In some embodiments, cooling element 120 includes a piezoelectric layer on substrate. The substrate may include or consist of stainless steel, a Ni alloy, Hastelloy, Al (e.g. an Al alloy), and/or Ti (e.g. a Ti alloy such as Ti6Al-4V). In some embodiments, a piezoelectric layer includes multiple sublayers formed as thin films on the substrate. In other embodiments, the piezoelectric layer may be a bulk layer affixed to the substrate. Such a piezoelectric cooling element 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation, or other layers might be included in the piezoelectric cooling element. Thus, cooling element 120 may be actuated using a piezoelectric.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, cooling element 120 has been actuated so that its tip 121 moves away from top plate 110. FIG. 1C can thus be considered to depict the end of a down stroke of cooling element 120. Because of the vibrational motion of cooling element 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when cooling element 120 is at the neutral position. As the down stroke continues, bottom chamber 150 decreases in size and top chamber 140 increases in size as shown in FIG. 1C. Thus, fluid is driven out of orifices 132 in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat-generating structure 102 is shown by unlabeled arrows in FIG. 1C.

Cooling element 120 is also actuated so that tip 121 moves away from heat-generating structure 102 and toward top plate 110. FIG. 1D can thus be considered to depict the end of an up stroke of cooling element 120. Because of the motion of cooling element 120, gap 142 has decreased in size and is shown as gap 142C. Gap 152 has increased in size and is shown as gap 152C. During the upstroke, a higher (e.g. maximum) pressure is developed at the periphery when cooling element 120 is at the neutral position. As the upstroke continues, bottom chamber 150 increases in size and top chamber 140 decreases in size as shown in FIG. 1D. Thus, the fluid is driven from top chamber 140 (e.g. the periphery of chamber 140/150) to bottom chamber 150. Thus, when tip 121 of cooling element 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of cooling element 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 150. Moreover, cooling system 100 may operate such that fluid is drawn in through vent 112 and driven out through orifices 132 without cooling element 120 contacting top plate 110 or orifice plate 130. Thus, pressures are developed within chambers 140 and 150 that effectively open and close vent 112 and orifices 132 such that fluid is driven through cooling system 100 as described herein.

The motion between the positions shown in FIGS. 1C and 1D is repeated. Thus, cooling element 120 undergoes vibrational motion indicated in FIGS. 1A-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at frequencies from 15 kHz through 30 kHz. In some embodiments, cooling element 120 vibrates at a frequency/frequencies of at least 20 kHz and not more than 30 kHz. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

FIGS. 1E-1F depict an embodiment of active MEMS cooling system 100 including centrally anchored cooling element 120 in which the cooling element is driven out-of-phase. More specifically, sections of cooling element 120 on opposite sides of anchor 160 (and thus on opposite sides of the central region of cooling element 120 that is supported by anchor 160) are driven to vibrate out-of-phase. In some embodiments, sections of cooling element 120 on opposite sides of anchor 160 are driven at or near one hundred and eighty degrees out-of-phase. Thus, one section of cooling element 120 vibrates toward top plate 110, while the other section of cooling element 120 vibrates toward orifice plate 130/heat-generating structure 102. Movement of a section of cooling element 120 toward top plate 110 (an upstroke) drives fluid in top chamber 140 to bottom chamber 150 on that side of anchor 160. Movement of a section of cooling element 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. Because fluid is driven through orifices 132 at high speeds, cooling system 100 may be viewed as a MEMs jet. The movement of fluid is shown by unlabeled arrows in FIGS. 1E and 1F. The motion between the positions shown in FIGS. 1E and 1F is repeated. Thus, cooling element 120 undergoes vibrational motion indicated in FIGS. 1A, 1E, and 1F, alternately drawing fluid through vent 112 from the distal side of top plate 110 into top chamber 140 for each side of cooling element 120; transferring fluid from each side of top chamber 140 to the corresponding side of bottom chamber 150; and pushing the fluid through orifices 132 on each side of anchor 160 and toward heat-generating structure 102. As discussed above, cooling element 120 is driven to vibrate at or near the structural resonant frequency of cooling element 120. Further, the structural resonant frequency of cooling element 120 is configured to align with the acoustic resonance of the chamber 140/150. The structural and acoustic resonant frequencies are generally chosen to be in the ultrasonic range. For example, the vibrational motion of cooling element 120 may be at the frequencies described for in-phase vibration. The structural resonant frequency of cooling element 120 is within ten percent of the acoustic resonant frequency of cooling system 100. In some embodiments, the structural resonant frequency of cooling element 120 is within five percent of the acoustic resonant frequency of cooling system 100. In some embodiments, the structural resonant frequency of cooling element 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to the distal side of top plate 110 after cooling. In other embodiments, heated fluid is carried away and replaced by new fluid at the distal side of cooling element 120. As a result, heat-generating structure 102 may be cooled.

Although shown in the context of a uniform cooling element in FIGS. 1A-1F, cooling system 100 may utilize cooling elements having different shapes. FIG. 1G depicts an embodiment of engineered cooling element 120' having a tailored geometry and usable in a cooling system such as cooling system 100. Cooling element 120' includes an anchored region 122 and cantilevered arms 123. Anchored region 122 is supported (e.g. held in place) in cooling system 100 by anchor 160. Cantilevered arms 123 undergo vibrational motion in response to cooling element 120' being actuated. Each cantilevered arm 123 includes step region 124, extension region 126 and outer region 128. In the embodiment shown in FIG. 1G, anchored region 122 is centrally located. Step region 124 extends outward from anchored region 122. Extension region 126 extends outward from step region 124. Outer region 128 extends outward from extension region 126. In other embodiments, anchored region 122 may be at one edge of the actuator and outer region 128 at the opposing edge. In such embodiments, the actuator is edge anchored.

Extension region 126 has a thickness (extension thickness) that is less than the thickness of step region 124 (step thickness) and less than the thickness of outer region 128 (outer thickness). Thus, extension region 126 may be viewed as recessed. Extension region 126 may also be seen as providing a larger bottom chamber 150. In some embodiments, the outer thickness of outer region 128 is the same as the step thickness of step region 124. In some embodiments, the outer thickness of outer region 128 is different from the step thickness of step region 124. In some embodiments, outer region 128 and step region 124 each have a thickness of at least three hundred twenty micrometers and not more than three hundred and sixty micrometers. In some embodiments, the outer thickness is at least fifty micrometers and not more than two hundred micrometers thicker than the extension thickness. Stated differently, the step (difference in step thickness and extension thickness) is at least fifty micrometers and not more than two hundred micrometers. In some embodiments, the outer step (difference in outer thickness and extension thickness) is at least fifty micrometers and not more than two hundred micrometers. Outer region 128 may have a width, o, of at least one hundred micrometers and not more than three hundred micrometers. Extension region 126 has a length, e, extending outward from the step region of at least 0.5 millimeter and not more than 1.5 millimeters in some embodiments. In some embodiments, outer region 128 has a higher mass per unit length in the direction from anchored region 122 than extension region 126. This difference in mass may be due to the larger size of outer region 128, a difference in density between portions of cooling element 120, and/or another mechanism.

Use of engineered cooling element 120' may further improve efficiency of cooling system 100. Extension region 126 is thinner than step region 124 and outer region 128. This results in a cavity in the bottom of cooling element 120' corresponding to extension region 126. The presence of this cavity aids in improving the efficiency of cooling system 100. Each cantilevered arm 123 vibrates towards top plate 110 in an upstroke and away from top plate 110 in a downstroke. When a cantilevered arm 123 moves toward top plate 110, higher pressure fluid in top chamber 140 resists the motion of cantilevered arm 123. Furthermore, suction in bottom chamber 150 also resists the upward motion of cantilevered arm 123 during the upstroke. In the downstroke of cantilevered arm 123, increased pressure in the bottom chamber 150 and suction in top chamber 140 resist the downward motion of cantilevered arm 123. However, the presence of the cavity in cantilevered arm 123 corresponding to extension region 126 mitigates the suction in bottom chamber 150 during an upstroke. The cavity also reduces the increase in pressure in bottom chamber 150 during a downstroke. Because the suction and pressure increase are reduced in magnitude, cantilevered arms 123 may more readily move through the fluid. This may be achieved while substantially maintaining a higher pressure in top chamber 140, which drives the fluid flow through cooling system 100. Moreover, the presence of outer region 128 may improve the ability of cantilevered arm 123 to move through the fluid being driven through cooling system 100. Outer region 128 has a higher mass per unit length and thus a higher momentum. Consequently, outer region 128 may improve the ability of cantilevered arms 123 to move through the fluid being driven through cooling system 100. The magnitude of the deflection of cantilevered arm 123 may also be increased. These benefits may be achieved while maintaining the stiffness of cantilevered arms 123 through the use of thicker step region 124. Further, the larger thickness of outer region 128 may aid in pinching off flow at the bottom of a downstroke. Thus, the ability of cooling element 120' to provide a valve preventing backflow through orifices 132 may be improved. Thus, performance of cooling system 100 employing cooling element 120' may be improved.

Further, cooling elements used in cooling system 100 may have different structures and/or be mounted differently than depicted in FIGS. 1A-1G. In some embodiments, the cooling element may have rounded corners and/or rounded ends but still be anchored along a central axis such that cantilevered arms vibrate. The cooling element may be anchored only at its central region such that the regions surrounding the anchor vibrate in a manner analogous to a jellyfish or the opening/closing of an umbrella. In some such embodiments, the cooling element may be circular or elliptical in shape. In some embodiments, the anchor may include apertures through which fluid may flow. Such an anchor may be utilized for the cooling element being anchored at its top (e.g. to the top plate). Although not indicated in FIGS. 1A-1G, the piezoelectric utilized in driving the cooling element may have various locations and/or configurations. For example, the piezoelectric may be embedded in the cooling element, affixed to one side of the cooling element (or cantilevered arm(s)), may occupy some or all of the cantilevered arms, and/or may have a location that is close to or distal from the anchored region. In some embodiments, cooling elements that are not centrally anchored may be used. For example, a pair of cooling elements that have offset apertures, that are anchored at their ends (or all edges), and which vibrate out of phase may be used. Thus, various additional configurations of cooling element 120 and/or 120', anchor 160, and/or other portions of cooling system 100 may be used.

Using the cooling system 100 actuated for in-phase vibration or out-of-phase vibration of cooling element 120 and/or 120', fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because cooling element 120/120' may be vibrated at frequencies of 15 kHz or more, users may not hear any noise associated with actuation of cooling elements. If driven at or near structural and/or acoustic resonant frequencies, the power used in operating cooling systems may be significantly reduced. Cooling element 120/120' does not physically contact top plate 110 or orifice plate 130 during vibration. Thus, resonance of cooling element 120/120' may be more readily maintained. More specifically, physical contact between cooling element 120/120' and other structures disturbs the resonance conditions for cooling element 120/120'. Disturbing these conditions may drive cooling element 120/120' out of resonance. Thus, additional power would need to be used to maintain actuation of cooling element 120/120'. Further, the flow of fluid driven by cooling element 120/120' may decrease. These issues are avoided through the use of pressure differentials and fluid flow as discussed above. The benefits of improved, quiet cooling may be achieved with limited additional power. Further, out-of-phase vibration of cooling element 120/120' allows the position of the center of mass of cooling element 120/120' to remain more stable. Although a torque is exerted on cooling element 120/120', the force due to the motion of the center of mass is reduced or eliminated. As a result, vibrations due to the motion of cooling element 120/120' may be reduced. Moreover, efficiency of cooling system 100 may be improved through the use of out-of-phase vibrational motion for the two sides of cooling element 120/120'. Consequently, performance of devices incorporating the cooling system 100 may be improved. Further, cooling system 100 may be usable in other applications (e.g. with or without heat-generating structure 102) in which high fluid flows and/or velocities are desired.

Figure 2A:
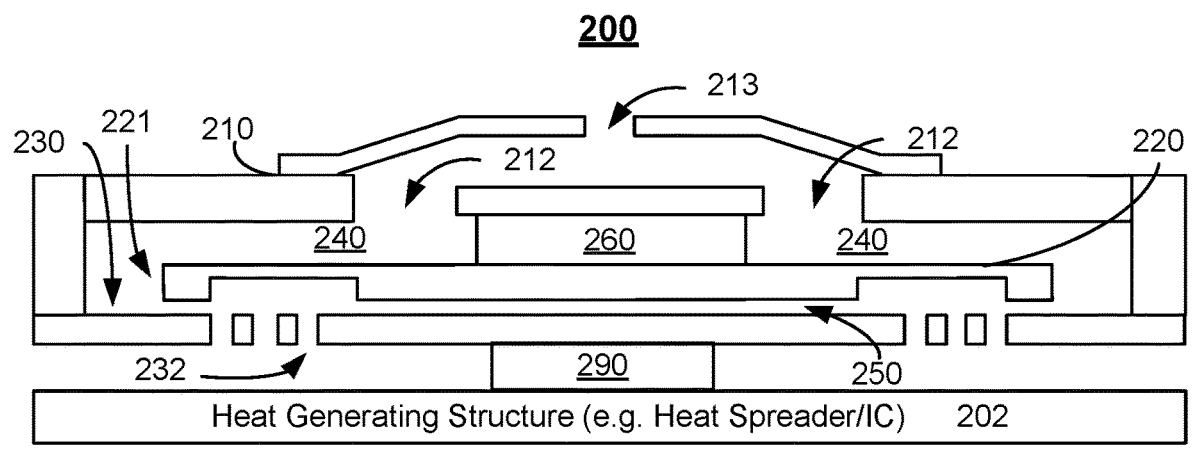
FIGS. 2A-2B depict an embodiment of an active MEMS cooling system including a centrally anchored cooling element.
Figure 2B:
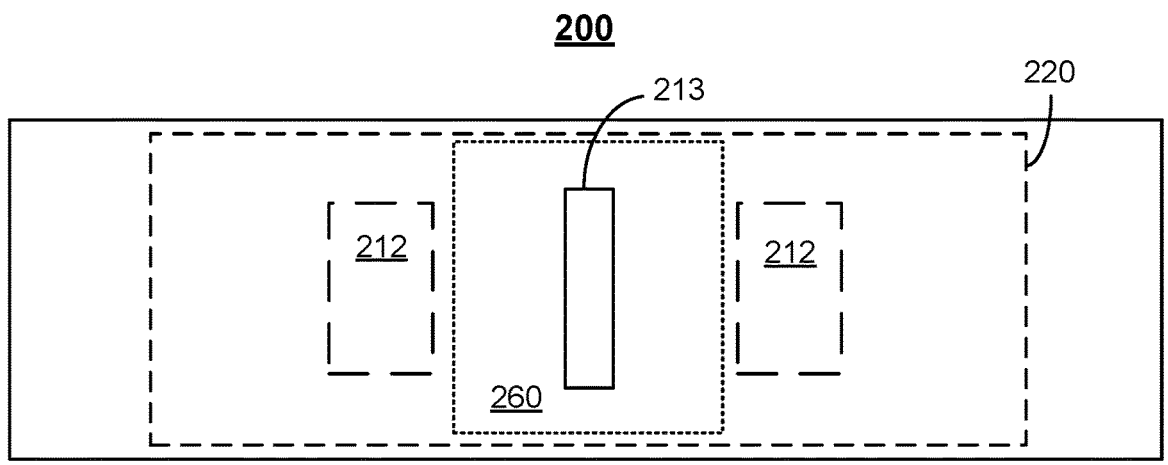

FIGS. 2A-2B depict an embodiment of active MEMS cooling system 200 including a top centrally anchored cooling element. FIG. 2A depicts a side view of cooling system 200 in a neutral position. FIG. 2B depicts a top view of cooling system 200. FIGS. 2A-2B are not to scale. For simplicity, only portions of cooling system 200 are shown. Referring to FIGS. 2A-2B, cooling system 200 is analogous to cooling system 100. Consequently, analogous components have similar labels. For example, cooling system 200 is used in conjunction with heat-generating structure 202, which is analogous to heat-generating structure 102.

Cooling system 200 includes top plate 210 having vents 212, cooling element 220 having tip 221, orifice plate 230 including orifices 232, top chamber 240 having a gap, bottom chamber 250 having a gap, flow chamber 240/250, and anchor (i.e. support structure) 260 that are analogous to top plate 110 having vent 112, cooling element 120 having tip 121, orifice plate 130 including orifices 132, top chamber 140 having gap 142, bottom chamber 150 having gap 152, flow chamber 140/150, and anchor (i.e. support structure) 160, respectively. Also shown is pedestal 290 that is analogous to pedestal 190. Thus, cooling element 220 is centrally supported by anchor 260 such that at least a portion of the perimeter of cooling element 220 is free to vibrate. In some embodiments, anchor 260 extends along the axis of cooling element 220. In other embodiments, anchor 260 is only near the center portion of cooling element 220. Although not explicitly labeled in FIGS. 2A and 2B, cooling element 220 includes an anchored region and cantilevered arms including step region, extension region, and outer regions analogous to anchored region 122, cantilevered arms 123, step region 124, extension region 126, and outer region 128 of cooling element 120'. In some embodiments, cantilevered arms of cooling element 220 are driven in-phase. In some embodiments, cantilevered arms of cooling element 220 are driven out-of-phase. In some embodiments, a simple cooling element, such as cooling element 120, may be used.

Anchor 260 supports cooling element 220 from above. Thus, cooling element 220 is suspended from anchor 260. Anchor 260 is suspended from top plate 210. Top plate 210 includes vent 213. Vents 212 on the sides of anchor 260 provide a path for fluid to flow into sides of chamber 240.

As discussed above with respect to cooling system 100, cooling element 220 may be driven to vibrate at or near the structural resonant frequency of cooling element 220. Further, the structural resonant frequency of cooling element 220 may be configured to align with the acoustic resonance of the chamber 240/250. The structural and acoustic resonant frequencies are generally chosen to be in the ultrasonic range. For example, the vibrational motion of cooling element 220 may be at the frequencies described with respect to cooling system 100. Consequently, efficiency and flow rate may be enhanced. However, other frequencies may be used.

Cooling system 200 operates in an analogous manner to cooling system 100. Cooling system 200 thus shares the benefits of cooling system 100. Thus, performance of a device employing cooling system 200 may be improved. In addition, suspending cooling element 220 from anchor 260 may further enhance performance. In particular, vibrations in cooling system 200 that may affect other cooling cells (not shown) may be reduced. For example, less vibration may be induced in top plate 210 due to the motion of cooling element 220. Consequently, cross talk between cooling system 200 and other cooling systems (e.g. other cells) or other portions of the device incorporating cooling system 200 may be reduced. Thus, performance may be further enhanced.

Figure 3A:
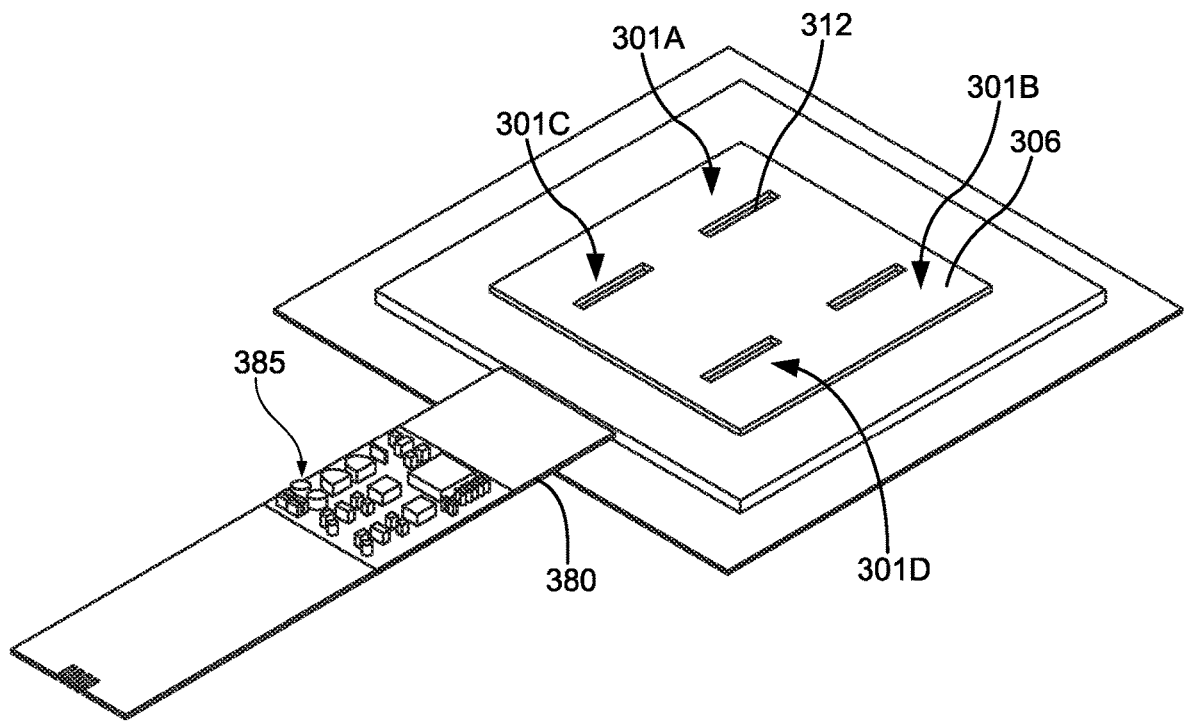
FIGS. 3A-3E depict an embodiment of an active MEMS cooling system formed in a tile.
Figure 3B:
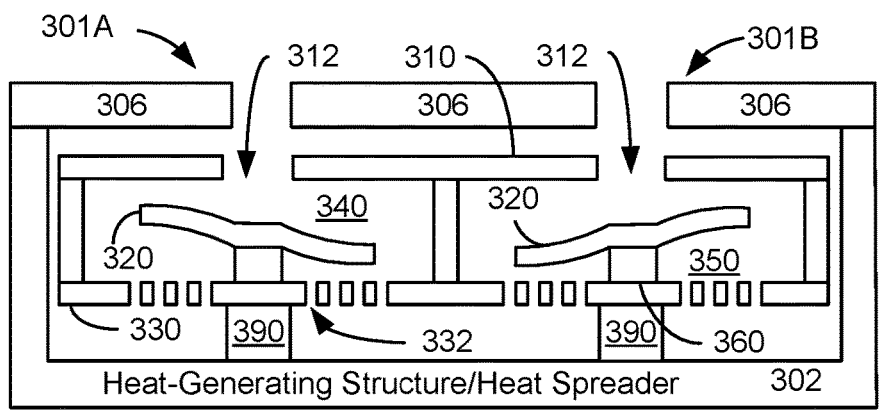
Figure 3C:
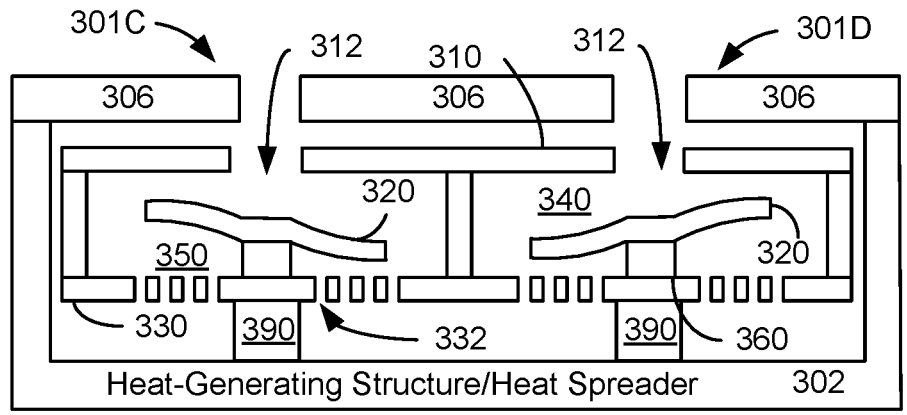
Figure 3D:
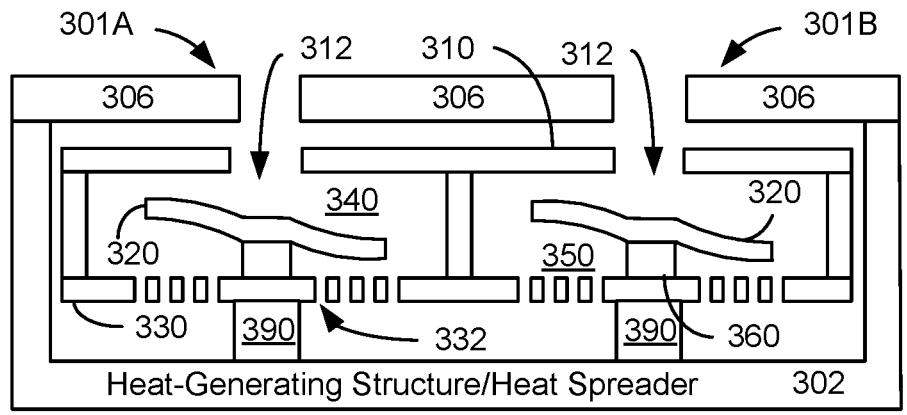
Figure 3E:
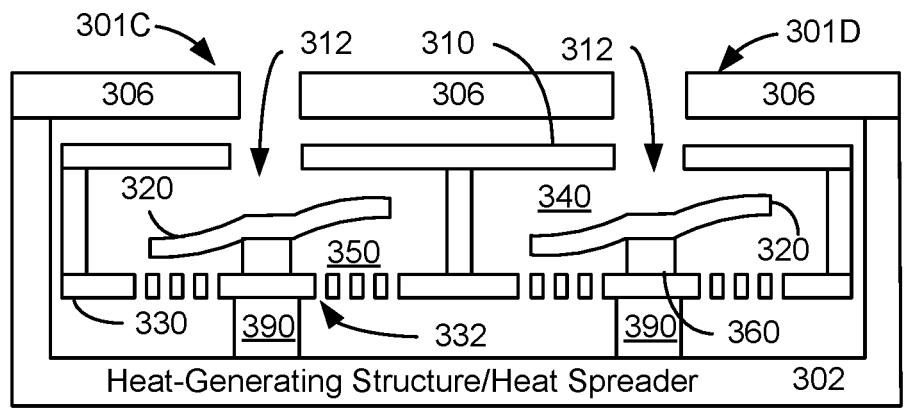

FIGS. 3A-3E depict an embodiment of active MEMS cooling system 300 including multiple cooling cells configured as a module termed a tile, or array. FIG. 3A depicts a perspective view, while FIGS. 3B-3E depict side views. FIGS. 3A-3E are not to scale. Cooling system 300 includes four cooling cells 301A, 301B, 301C and 301D (collectively or generically 301), which are analogous to one or more of cooling systems described herein. More specifically, cooling cells 301 are analogous to cooling system 100 and/or 200. Tile 300 thus includes four cooling cells 301 (i.e. four MEMS jets). Although four cooling cells 301 in a 2×2 configuration are shown, in some embodiments another number and/or another configuration of cooling cells 301 might be employed. In the embodiment shown, cooling cells 301 include shared top plate 310 having apertures 312, cooling elements 320, shared orifice plate 330 including orifices 332, top chambers 340, bottom chambers 350, anchors (support structures) 360, and pedestals 390 that are analogous to top plate 110 having apertures 112, cooling element 120, orifice plate 130 having orifices 132, top chamber 140, bottom chamber 150, anchor 160, and pedestal 190. In some embodiments, cooling cells 301 may be fabricated together and separated, for example by cutting through top plate 310, side walls between cooling cells 301, and orifice plate 330. Thus, although described in the context of a shared top plate 310 and shared orifice plate 330, after fabrication cooling cells 301 may be separated. In some embodiments, tabs (not shown) and/or other structures such as anchors 360 may connect cooling cells 301. Further, tile 300 includes heat-generating structure (termed a heat spreader hereinafter) 302 (e.g. a heat sink, a heat spreader, and/or other structure) that also has sidewalls, or fencing, in the embodiment shown. Cover plate 306 having apertures therein is also shown. Heat spreader 302 and cover plate 306 may be part of an integrated tile 300 as shown or may be separate from tile 300 in other embodiments. Heat spreader 302 and cover plate 306 may direct fluid flow outside of cooling cells 301, provide mechanical stability, and/or provide protection. Electrical connection to cooling cells 301 is provided via flex connector 380 (not shown in FIGS. 3B-5E) which may house drive electronics 385. Cooling elements 320 are driven out-of-phase (i.e. in a manner analogous to a seesaw). Further, as can be seen in FIGS. 3B-3C and FIGS. 3D-3E cooling element 320 in one cell is driven out-of-phase with cooling element(s) 320 in adjacent cell(s). In FIGS. 3B-3C, cooling elements 320 in a row are driven out-of-phase. Thus, cooling element 320 in cell 301A is out-of-phase with cooling element 320 in cell 301B. Similarly, cooling element 320 in cell 301C is out-of-phase with cooling element 320 in cell 301D. In FIGS. 3D-3E, cooling elements 320 in a column are driven out-of-phase. Thus, cooling element 320 in cell 301A is out-of-phase with cooling element 320 in cell 301C. Similarly, cooling element 320 in cell 301B is out-of-phase with cooling element 320 in cell 301D. By driving cooling elements 320 out-of-phase, vibrations in cooling system 300 may be reduced. Cooling elements 320 may be driven in another manner in some embodiments.

Cooling cells 301 of cooling system 300 function in an analogous manner to cooling system(s) 100, 200, and/or an analogous cooling system. Consequently, the benefits described herein may be shared by cooling system 300. Because cooling elements in nearby cells are driven out-of-phase, vibrations in cooling system 300 may be reduced. Because multiple cooling cells 301 are used, cooling system 300 may enjoy enhanced cooling capabilities. Further, multiples of individual cooling cells 301 and/or cooling system 300 may be combined in various fashions to obtain the desired footprint of cooling cells.

Figure 4:
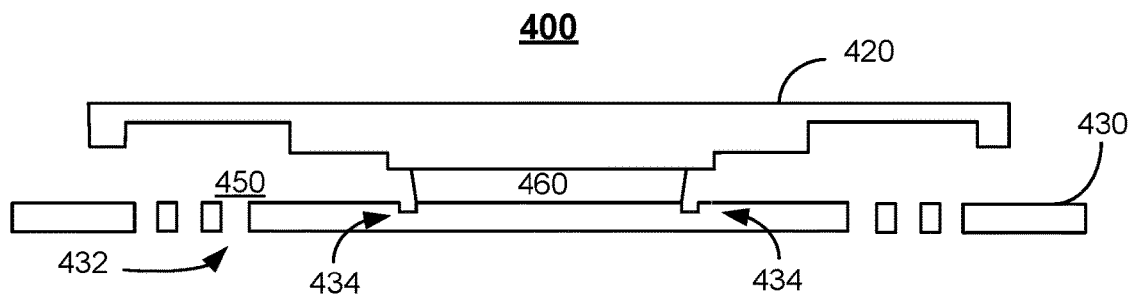
FIG. 4 depicts an embodiment of a portion of an active MEMS cooling system having at least a portion of an anchor formed using adhesive.

FIG. 4 depicts an embodiment of a portion of active MEMS cooling system 400 having at least a portion of an anchor formed using adhesive. FIG. 4 is not to scale and for clarity, only some structures are shown. Cooling system 400 may be a cell that is part of a cooling system including multiple cells, such as tile 300. The device cooled by MEMS cooling system 400 may be a laptop computer, a tablet or notebook computer, a smart phone, and/or other mobile device. The device may also be another device, such as a server in a rack, a game console, or a desktop computer. In some embodiments, therefore, the device is thin. For example, in some embodiments, the device in which cooling system 400 is integrated has a thickness (height along the smallest dimension, perpendicular to the bottom plate 430 of FIG. 4) of not more than twenty-five millimeters. The thickness is not more than ten millimeters in some embodiments. In some such embodiments, the thickness of the device incorporating cooling system 400 is not more than eight millimeters. However, other thicknesses are possible. In some such embodiments, cooling system 400 when used in a tile such as tile 300 has a thickness of less than three millimeters.

Cooling system 400 includes cooling element 420, bottom plate 430 having orifices 432, bottom chamber 450, and anchor 460 that are analogous to cooling element 120', bottom plate (e.g. orifice plate) 130 having orifices 132, bottom chamber 150, and anchor 160, respectively. A top plate having vents therein, a top chamber having a gap, a flow chamber, a heat generating structure, and a pedestal are not shown but may be present and are analogous to corresponding structures of system 100. Cooling element 420 is centrally supported by anchor 460 such that at least a portion of the perimeter of cooling element 420 is free to vibrate. In some embodiments, anchor 460 extends along the axis of cooling element 420 (i.e. perpendicular to the plane of the page). In other embodiments, anchor 460 is only near the center portion of cooling element 420. Although not explicitly labeled in FIG. 4, cooling element 420 includes an anchored region coupled to anchor 460 and cantilevered arms. Although not labeled, the cantilevered arms include step regions, extension regions and outer regions analogous to anchored region 122, cantilevered arms 123, step region 124, extension region 126 and outer region 128 of cooling element 120'. The anchored region of cooling element 420 is part of a thicker central region coupled with anchor 460. In some embodiments, the thickness of cooling element 420 is constant between extension regions. Cantilevered arms of cooling element 420 may be driven in-phase. In some embodiments, cantilevered arms of cooling element 420 are driven out-of-phase. In some embodiments, another cooling element such as a simple cooling element 120, may be used.

Anchor 460 includes adhesive and couples cooling element 420 to bottom plate 430. In the embodiment depicted in FIG. 4, anchor 460 consists of adhesive. However, in other embodiments, the anchor may be only partially formed of adhesive and/or the anchor may simply be affixed to bottom plate 430 and/or cooling element 420 using adhesive. The characteristics of the adhesive used in anchor 460 include a high Young's modulus. For example, the Young's modulus may be at least (or greater than) two Gpa. In some embodiments, the Young's modulus of the adhesive may be at least (or greater than) ten Gpa. In some embodiments, the adhesive for anchor 460 may be a braze alloy or a solder. As such, the term "adhesive" may include a braze alloy and/or solder. Cooling element 420 and bottom plate 430 are appropriately joined using the process consistent with the adhesive used. The adhesive is desired to have good adhesion to the material(s) used for bottom plate 430 and cooling element 420. For example, the adhesive may be desired to bond well to materials including or consisting of stainless steel (e.g. SUS304 and/or SUS316), copper, Al7075, Al6063, Ti64, Ti Grade 2, Ti Grade 9, a beryllium-copper alloy, Monel, aluminum bronze, and/or aluminum. The thickness of the adhesive (and thus anchor 460) may be at least 0.5 micrometer and not more than fifty micrometers. In some embodiments, the thickness of the adhesive (and/or anchor 460) may be at least one micrometer and not more than twenty micrometers. In some such embodiments, anchor 460 has a thickness of at least four micrometers and not more than six micrometers (e.g. nominally five micrometers). Examples of materials that might be used for the adhesive include but may not be limited to high modulus thermal cure epoxies such as ThreeBond adhesive TB2235S, TB1655, die attach films, solder, and/or braze alloys.

Also depicted in FIG. 4 are trenches 434 in bottom plate 430. Trenches 434 are used in conjunction with the adhesive for anchor 460. In the embodiment shown, some or all of anchor 460 is formed of one or more adhesive(s). Trenches 434 are used to define lateral dimensions of the adhesive portion of anchor 460 coupled with bottom plate 430. Trenches 434 are also used to determine the location of anchor 460. Thus, trenches 434 may be used to align anchor 460 with respect to bottom plate 430. In the embodiment shown, the width of anchor 460 is at least 0.5 mm and not more than 3 mm.

The frequency of vibration of anchor 460 depends upon the length of the portion of cooling element 420 that is free to vibrate. Thus, the length of anchor 460 is desired to be controlled to provide the desired length of the cantilevered arms. In some embodiments, the smallest lateral dimension of anchor 460 controls this length. In the embodiment shown in FIG. 4, therefore, the bottom of anchor 460 determines the width.

The alignment of anchor 460 with respect to cooling element 420 and bottom plate 430 is desired to be controlled. In addition, alignment and adhesive overflow are desired to be characterized and controlled. During bonding, the adhesive used for anchor 460 wets the surfaces of cooling element 420 and bottom plate 430. The adhesive tends to travel along the larger surface (the space between trenches 434), but is at least partially pinned by trenches 434. Adhesive provided between trenches 434 flows along the surface of bottom plate 430 but does not flow past trenches. Trenches 434 may, therefore, be used to control (and pin) the flow of the adhesive used in forming anchor 460. By controlling the volume of adhesive in connection with the layout of trenches 434, the size and location of anchor 460 may be controlled. For example, the thickness of anchor 460 may be determined by spacers in the adhesive (e.g. balls or rods therein). The location of the bottom of anchor 460 is between trenches 434. Thus, use of trenches 434 provides a deterministic width and location of anchor 460 with respect to bottom plate 430.

Cooling system 400 operates in an analogous manner to cooling system 100. Cooling system 400 thus shares the benefits of cooling system 100. Thus, performance of a device employing cooling system 400 may be improved. Further, use of trenches 434 provides a deterministic size and location of anchor 460 with respect to bottom plate 430. As such, alignment of anchor 460 and cooling element 420 with respect to bottom plate 430 may be improved. Further, the frequency of the two cantilevered arms may be better controlled. For example, anchor 460 may be symmetrically located within cooling system 400. As a result, performance may be improved.

Figure 5:
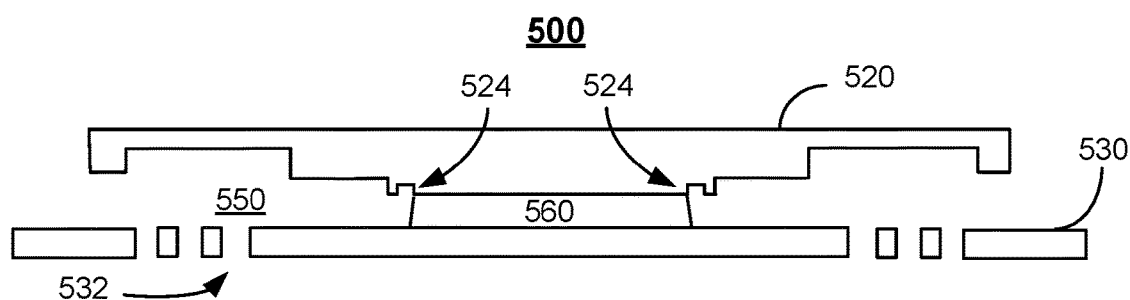
FIG. 5 depicts an embodiment of a portion of an active MEMS cooling system having at least a portion of an anchor formed using adhesive.

FIG. 5 depicts an embodiment of a portion of active MEMS cooling system 500 having at least a portion of an anchor formed using adhesive. FIG. 5 is not to scale and for clarity, only some structures are shown. Cooling system 500 may be a cooling cell that is part of a cooling system including multiple cells, such as tile 300. The device cooled by MEMS cooling system 500 may be analogous to those with which system 400 is used. For example, in some embodiments, the device in which cooling system 500 is integrated has a thickness analogous to those described with respect to cooling system 400.

Cooling system 500 includes cooling element 520, bottom plate 530 having orifices 532, bottom chamber 550, and anchor 560 that are analogous to cooling element 420 and 120', bottom plate 430 and 130 having orifices 432 and 132, bottom chamber 450 and 150, and anchor 460 and 160, respectively. A top plate having vents therein, a top chamber having a gap, a flow chamber and a pedestal are not shown but may be present and are analogous to corresponding structures of system 100. Cooling element 520 is centrally supported by anchor 560 such that at least a portion of the perimeter of cooling element 520 is free to vibrate. In some embodiments, anchor 560 extends along the axis of cooling element 520 (i.e. perpendicular to the plane of the page). In other embodiments, anchor 560 is only near the center portion of cooling element 520. Although not explicitly labeled in FIG. 5, cooling element 520 includes an anchored region coupled to anchor 560 and cantilevered arms. Although not labeled, the cantilevered arms include step regions, extension regions and outer regions analogous to anchored region 122, cantilevered arms 123, step region 124, extension region 126 and outer region 128 of cooling element 120'. The anchored region of cooling element 520 is part of a thicker central region coupled with anchor 560. In some embodiments, the thickness of cooling element 520 is constant between extension regions. Cantilevered arms of cooling element 520 may be driven in-phase. In some embodiments, cantilevered arms of cooling element 520 are driven out-of-phase. In some embodiments, another cooling element, such as a simple cooling element 120, may be used.

Cooling system 500 includes anchor 560 and trenches 524. Anchor 560 is analogous to anchor 460. Thus, anchor 560 includes adhesive and couples cooling element 520 to bottom plate 530. In the embodiment depicted in FIG. 5, anchor 560 consists of adhesive. However, in other embodiments, the anchor may be only partially formed of adhesive and/or the anchor may simply be affixed to bottom plate 530 and/or cooling element 520 using adhesive. The characteristics of the adhesive used in anchor 560 are analogous to those used for anchor 460. Examples of epoxies that might be used for the adhesive include but may not be limited to high modulus thermal epoxies, high modulus die attach films, braze alloys, and/or solder. In some embodiments, the size of anchor 560 is analogous to the size of anchor 460.

Trenches 524 are in cooling element 520. Trenches 524 are used in conjunction with the adhesive for anchor 560. Trenches 524 function in an analogous manner to trenches 434 in cooling system 400. Trenches 524 act as a stop for adhesive used for anchor 560. Trenches 524 define lateral dimensions of the adhesive portion of anchor 560 coupled with cooling element 520. Thus, the width of anchor 560 at cooling element 520 is determined by trenches 524. Further, the location of the connection between anchor 560 and cooling element 520 is determined by trenches 524. Trenches 524 may be used to align anchor 560 with respect to cooling element 520. Anchor 560 may be symmetrically located with respect to the cantilevered arms of cooling element 520. Thus, the connection between anchor 560 and cooling element 520 is deterministic. Because bottom plate 530 does not include trenches, the connection between anchor 560 and bottom plate 530 may be more varied.

Cooling system 500 operates in an analogous manner to cooling systems 100 and 400. Cooling system 500 thus shares the benefits of cooling system 100. Thus, performance of a device employing cooling system 500 may be improved. Further, use of trenches 524 provides a deterministic size and location of anchor 560 with respect to cooling element 520. As such, alignment of anchor 560 with respect to cooling element 520 may be improved.

Figure 6:
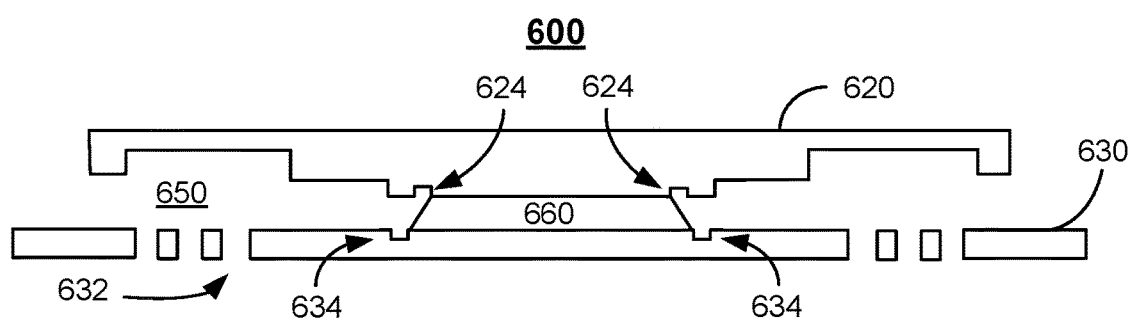
FIG. 6 depicts an embodiment of a portion of an active MEMS cooling system having at least a portion of an anchor formed using adhesive.

FIG. 6 depicts an embodiment of a portion of active MEMS cooling system 600 having at least a portion of an anchor formed using adhesive. FIG. 6 is not to scale and for clarity, only some structures are shown. Cooling system 600 may be a cooling cell that is part of a cooling system including multiple cells, such as tile 300. The device cooled by MEMS cooling system 600 may be analogous to devices with which cooling system 400 is used. For example, in some embodiments, the device in which cooling system 600 is integrated has a thickness analogous to those described with respect to cooling system 400.

Cooling system 600 includes cooling element 620, bottom plate 630 having orifices 632, bottom chamber 650, and anchor 660 that are analogous to cooling element 420, 520, and 120'; bottom (e.g. orifice) plate 430, 530, and 130 having orifices 432, 532, and 132; bottom chamber 450, 550, and 150; and anchor 460, 560, and 160, respectively. A top plate having vents therein, a top chamber having a gap, a flow chamber and a pedestal are not shown but may be present and are analogous to corresponding structures of system 100. Cooling element 620 is centrally supported by anchor 660 such that at least a portion of the perimeter of cooling element 620 is free to vibrate. In some embodiments, anchor 660 extends along the axis of cooling element 620 (i.e. perpendicular to the plane of the page). In other embodiments, anchor 660 is only near the center portion of cooling element 620. Although not explicitly labeled in FIG. 6, cooling element 620 includes an anchored region coupled to anchor 660 and cantilevered arms. Although not labeled, the cantilevered arms include step regions, extension regions and outer regions analogous to anchored region 122, cantilevered arms 123, step region 124, extension region 126 and outer region 128 of cooling element 120'. The anchored region of cooling element 620 is part of a thicker central region coupled with anchor 660. In some embodiments, the thickness of cooling element 620 is constant between extension regions. In some embodiments, cantilevered arms of cooling element 620 are driven in-phase. In some embodiments, cantilevered arms of cooling element 620 are driven out-of-phase. In some embodiments, another cooling element such as a simple cooling element 120, may be used.

Cooling system 600 includes anchor 660 and trenches 624 and 634. Anchor 660 is analogous to anchor 460. Thus, anchor 660 includes adhesive and couples cooling element 620 to bottom plate 630. In the embodiment depicted in FIG. 6, anchor 660 consists of adhesive. However, in other embodiments, the anchor may be only partially formed of adhesive and/or the anchor may simply be affixed to bottom plate 630 and/or cooling element 620 using adhesive. The characteristics of the adhesive used in anchor 660 are analogous to those used for anchor 460. In some embodiments, the size of anchor 660 is analogous to the size of anchor 460.

Trenches 624 are in cooling element 620, while trenches 634 are in bottom plate 630. Trenches 624 and 634 are analogous to trenches 524 and 424, respectively. Trenches 624 and 634 function in an analogous manner to trenches 434 in cooling system 400 and to trenches 524 in cooling system 500. Trenches 624 and 634 act as a stop for adhesive used for anchor 660. Trenches 624 define lateral dimensions and location of the adhesive portion of anchor 660 coupled with cooling element 620. Thus, the width of anchor 660 at cooling element 620 is determined by trenches 624. Trenches 634 define lateral dimensions and location of the adhesive portion of anchor 660 coupled with bottom plate 630. Thus, the width of anchor 660 at bottom plate 630 is determined by trenches 634. Trenches 624 may be used to align anchor 660 with respect to cooling element 620. Similarly, trenches 634 may be used to align anchor 660 with respect to bottom plate 630. Consequently, the location and alignment of anchor 660 with respect to both cooling element 620 and bottom plate 630 may be deterministic. As a result, both the location of anchor 660 on cooling element 620 (e.g. so that anchor 660 is centered in cooling element 620) and the connection between cooling element 620 and bottom plate 630 (e.g. the alignment between cooling element 620 and bottom plate 630) are improved.

In the embodiment shown, trenches 634 are spaced further apart than trenches 624. Differences in spacing between trenches 634 and trenches 624 may further improve performance of anchor 660. Accurate alignment of trenches 634 and 624 may be complicated if trenches 634 and 624 have the same spacing. This is because the width of anchor 660 as well as the location of anchor 660 are both desired to be determined and both are controlled by the locations of trenches 624 and 634. Differences in spacing ensure that trenches 624 set the width of anchor 660 (because trenches 624 are more closely spaced) while allowing alignment between cooling element 620 and bottom plate 630.

Cooling system 600 operates in an analogous manner to cooling systems 100, 400, and 500. Cooling system 600 thus shares the benefits of cooling system 100. Thus, performance of a device employing cooling system 600 may be improved. Further, use of trenches 624 and 634 provides a deterministic size and location of anchor 660 with respect to cooling element 620 and with respect to bottom plate 630. As such, alignment of anchor 660 and cooling element 620 with respect to bottom plate 630 may be improved. Anchor 660 may be symmetrically placed with respect to both cooling element 620 and bottom plate 630. Performance of cooling system 600 may also be improved.

Figure 7:
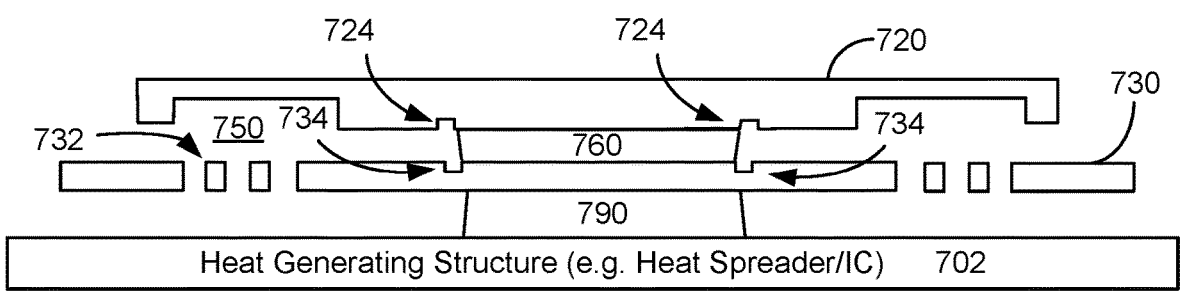
FIG. 7 depicts an embodiment of a portion of an active MEMS cooling system having at least a portion of an anchor formed using adhesive.

FIG. 7 depicts an embodiment of a portion of active MEMS cooling system 700 having at least a portion of an anchor formed using adhesive. FIG. 7 is not to scale and for clarity, only some structures are shown. Cooling system 700 may be a cooling cell that is part of a cooling system including multiple cells, such as tile 300. The device cooled by MEMS cooling system 700 may be analogous to those described with respect to cooling system 400. For example, in some embodiments, the device in which cooling system 700 is integrated has a thickness analogous to those described with respect to cooling system 400.

Cooling system 700 includes cooling element 720, bottom plate 730 having orifices 732, bottom chamber 750, and anchor 760 that are analogous to cooling element 420, 520, 620, and 120'; bottom (e.g. orifice) plate 430, 530, 630, and 130 having orifices 432, 532, 632, and 132; bottom chamber 450, 550, 650, and 150; and anchor 460, 560, 660, and 160, respectively. A top plate having vents therein, a top chamber having a gap, and a flow chamber are not shown but may be present and are analogous to corresponding structures of system 100. Also shown are pedestal 790 and heat generating structure 702 that are analogous to pedestal 190 and heat generating structure 102.

Cooling element 720 is centrally supported by anchor 760 such that at least a portion of the perimeter of cooling element 720 is free to vibrate. In some embodiments, anchor 760 extends along the axis of cooling element 720 (i.e. perpendicular to the plane of the page). In other embodiments, anchor 760 is only near the center portion of cooling element 720. Although not explicitly labeled in FIG. 7, cooling element 720 includes an anchored region coupled to anchor 760 and cantilevered arms. Although not labeled, the cantilevered arms include step regions, extension regions and outer regions analogous to anchored region 122, cantilevered arms 123, step region 124, extension region 126 and outer region 128 of cooling element 120'. The thickness of cooling element 720 is constant between extension regions. In some embodiments, the anchored region of cooling element 720 is part of a thicker central region coupled with anchor 760. In some embodiments, cantilevered arms of cooling element 720 are driven in-phase. In some embodiments, cantilevered arms of cooling element 720 are driven out-of-phase. In some embodiments, another cooling element, such as a simple cooling element 120, may be used.

Cooling system 700 includes anchor 760 and trenches 724 and 734. Anchor 760 and trenches 724 and 734 are analogous to anchor 660 and trenches 624 and 634. Thus, the structure, geometry, and function of trenches 724 and 734 and anchor 760 are analogous to the structure, geometry, and function of trenches 624 and 634 and anchor 660. However, trenches 724 are spaced further apart than trenches 734. Thus, the lowest width of anchor 760 is adjacent to bottom plate 730. The width of anchor 760 is considered to be this lowest width.

In addition, pedestal 790 may be analogous to anchor 760 in that some or all of pedestal 790 may be formed of adhesive. In some embodiments, the same adhesive as described with respect to cooling system 400 may be used for pedestal 790. Pedestal 790, and the adhesive used therein, are desired to maintain the mechanical isolation of cooling system 700, a tile in which cooling system 700 may reside, and heat generating structure 702. Thus, the adhesive used is desired to aid in minimizing or reducing the transfer of vibrations. Thermal contact between cooling system 700 and the heat generating structure 102 is desired to be maintained. Thus, the characteristics of the adhesive used for pedestal 790 include a Young's modulus of less than five MPA, a glass transition temperature of not more than twenty-five degrees Celsius, and/or a thermal conductivity of at least 0.8 W/meter-Kelvin in some embodiments.

Cooling system 700 operates in an analogous manner to cooling systems 100, 400, 500, and 600. Cooling system 700 thus shares the benefits of cooling system 100. Thus, performance of a device employing cooling system 700 may be improved. Further, use of trenches 724 and 734 provides a deterministic size and location of anchor 760 with respect to cooling element 720 and with respect to bottom plate 730. As such, alignment of anchor 760 and cooling element 720 with respect to bottom plate 730 may be improved. In addition, the lateral symmetry of cooling system 700 may be further improved. Further, coupling of cooling system 700 to heat generating structure 702 may also be improved. Performance of cooling system 700 may also be improved.

Figure 8:
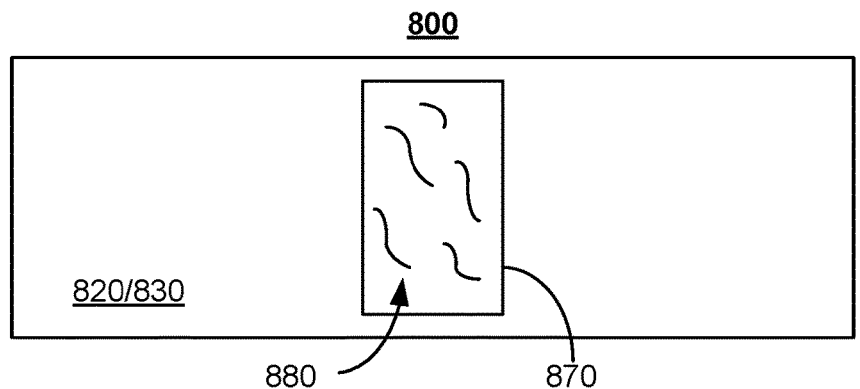
FIG. 8 depicts an embodiment of a portion of an active MEMS cooling system having at least a portion of an anchor formed using adhesive.

FIG. 8 depicts a plan view of an embodiment of a portion of active MEMS cooling system 800 having at least a portion of an anchor formed using adhesive. FIG. 8 is not to scale and for clarity, only some structures are shown. Cooling system 800 may be a cooling cell that is part of a cooling system including multiple cells, such as tile 300. The device cooled by MEMS cooling system 800 may be analogous to devices with which cooling system 400 is used. For example, in some embodiments, the device in which cooling system 800 is integrated has a thickness analogous to those described with respect to cooling system 400.

Bottom plate 830 and/or cooling element 820 is shown. Other portions of cooling system 800, such as a top plate, cavity, orifices in bottom plate 830, vents, sidewalls of the cooling system, and/or a pedestal are not shown but may be present. Also shown is anchor region 870 to which an anchor is to be affixed to cooling element 820 or bottom plate 830. In anchor region 870 are tortuous paths 880. Tortuous paths 880 may be trenches, ridges, and/or other analogous geometric features formed in cooling element 820 and/or bottom plate 830. Tortuous paths 880 aid in preventing delamination of the adhesive used for an anchor (not shown in FIG. 8). In particular, tortuous paths 880 may stop or slow the propagation of cracks forming in the adhesive for the anchor. Thus, delamination of the adhesive from bottom plate 830 and/or cooling element 820 may be reduced or prevented.

Cooling system 800 operates in an analogous manner to cooling systems 100, 400, 500, 600, and 700. Cooling system 800 thus shares the benefits of cooling system 100, 400, 500, 600, and/or 700. Thus, performance of a device employing cooling system 800 may be improved. Further, use of tortuous paths 880 may reduce delamination of the cooling element and/or anchor. Reliability of cooling system 800 may thus be improved.

Figure 9:
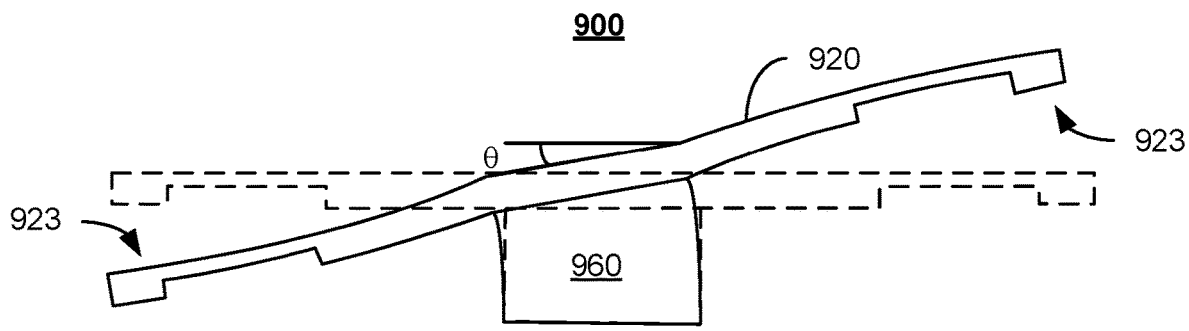
FIG. 9 depicts an embodiment of an active MEMS cooling system having an anchor that undergoes rotational motion.

FIG. 9 depicts a plan view of an embodiment of a portion of active MEMS cooling system 900. FIG. 9 is not to scale and for clarity, only some structures are shown. Cooling system 900 may be a cooling cell that is part of a cooling system including multiple cells, such as tile 300. The device cooled by MEMS cooling system 900 may be a laptop computer, a tablet or notebook computer, a smart phone, and/or other mobile device. The device may also be another device, such as a server in a rack, a game console, or a desktop computer. In some embodiments, therefore, the device is thin. For example, in some embodiments, the device in which cooling system 900 is integrated has a thickness analogous to those described with respect to cooling system 400.

Cooling system 900 includes cooling element 920 and anchor 960. Other portions of cooling system 900, such as a top plate, a bottom plate, cavities, orifices in the bottom plate, vents, sidewalls of the cooling system and/or a pedestal are not shown but may be present. Cooling element 920 is centrally supported by anchor 960 such that at least a portion of the perimeter of cooling element 920 is free to vibrate. In some embodiments, anchor 960 extends along the axis of cooling element 920 (i.e. perpendicular to the plane of the page). In other embodiments, anchor 960 is only near the center portion of cooling element 920. Although not explicitly labeled in FIG. 9, cooling element 920 includes an anchored region coupled to anchor 960 and cantilevered arms 923. Although not labeled, the cantilevered arms include step regions, extension regions and outer regions analogous to anchored region 122, cantilevered arms 123, step region 124, extension region 126 and outer region 128 of cooling element 120'. In some embodiments, another cooling element, such as a simple cooling element 120, may be used.

Cooling element 920 and anchor 960 are shown while undergoing vibrational motion. Cantilevered arms 923 of cooling element 920 are driven out-of-phase. Thus, cooling element 920 may vibrate between the configuration shown and a configuration in which the positions of the cantilevered arms 923 are reversed. The neutral positions of cooling element 920 and anchor 960 are shown in dashed lines.

Cooling system 900 functions in an analogous manner to cooling system 100. In addition, anchor 960 is sufficiently flexible that anchor 960 undergoes rotational motion when cooling element 920 undergoes vibrational motion. Thus, anchor 960 is shown as rotating by an angle, θ. For example, the top of anchor 960 that is coupled to cooling element 920 may undergo rotations by an angle of at least 0.1 degrees and not more than two degrees in some embodiments. In some such embodiments, the maximum rotation does not exceed 0.5 degrees. Other maximum rotations are possible.

Because cooling system 900 operates in an analogous manner to cooling systems 100, 400, 500, 600, 700, and 800, cooling system may share the benefits of cooling system 100, 400, 500, 600, 700, and/or 800. Thus, performance of a device employing cooling system 800 may be improved. Further, rotation of anchor 960 may enhance operation of cooling system 900. Rotation of anchor 960 may increase efficiency of cooling element 920. Because of the rotation of anchor 960, the motion of cooling element 920 is further from its neutral position than if anchor 960 were rigidly fixed. This larger range of motion of cooling element 920 allows cantilevered arms 923 to sweep more fluid (e.g. air) through cooling system 900 with each vibrational period. Thus, efficiency is improved. Because anchor 960 rotates, less stress is placed on cooling element 920. Stated differently, the peak strain on cooling element 920 may be reduced for a given range of motion of cooling element 920. This reduction of strain to which cooling element 920 is exposed may improve the reliability of cooling system 900.

Further, the structural energy dissipation of cooling system 900 may be reduced. Energy input to cooling system 900 results in vibrational motion of cooling element 920 as well as energy dissipation. A significant part of the energy dissipated is due to structural energy dissipation. Structural energy dissipation includes the energy consumed by the structure (e.g. cooling element 920) that does not result in movement of cooling element 920. Strain energy in cooling element 920 is a source of dissipation. Rotational motion of anchor 960 reduces strain in cooling element 920 and, therefore, strain energy dissipated. Thus, cooling system 900 may sweep a larger volume of fluid, have a lower structural energy dissipation, and an improved quality factor (which corresponds to the energy dissipated divided by the energy input to the system). Thus, performance and reliability of cooling system 900 may be improved.

In addition to or in lieu of using anchor 960 that may rotate, selection or material(s) for cooling element 920 and/or surrounding structures may reduce structural energy losses. In particular, material(s) that have low intrinsic losses may be used. For cooling element 920, the material used may also have a high acoustic velocity (e.g. greater than four thousand meters per second). The low internal losses include losses of at least 0.01 percent and not more than 0.1 percent. In some embodiments, the losses are less than 0.01 percent. For example, the material(s) used may include at least one of Al7075, Al6063, Ti64, Ti Grade 2, Ti Grade 9, a beryllium-copper alloy, Monel, aluminum bronze, aluminum bronze, aluminum, and/or stainless steel such as SUS304 and/or SUS316. In some embodiments, lower density materials such as Ti64 (as opposed to, for example, beryllium copper) may be desired to be used for cooling element 920. Thus, in addition to the performance improvement described above, structural losses of cooling system 900 may be further mitigated via selection of materials.

FIGS. 10A-10D depict embodiments of a portion of active MEMS cooling systems 1000A, 1000B, 1000C, and 1000D. FIGS. 10A-10D are not to scale and for clarity, only some structures are shown. Cooling systems 1000A, 1000B, 1000C, and/or 1000D may each be a cooling cell that is part of a cooling system including multiple cells, such as tile 300. The device cooled by MEMS cooling systems 1000A, 1000B, 1000C, and 1000D may be a laptop computer, a tablet or notebook computer, a smart phone, and/or other mobile device. The device may also be another device, such as a server in a rack, a game console, or a desktop computer. In some embodiments, therefore, the device is thin. For example, in some embodiments, the device in which cooling system 1000 is integrated has a thickness (height along the smallest dimension, perpendicular to the bottom plate 1030A) of not more than twenty-five millimeters. The thickness is not more than ten millimeters in some embodiments. In some such embodiments, the thickness of the device is not more than eight millimeters. However, other thicknesses are possible.

Cooling systems 1000A, 1000B, 1000C, and 1000D each includes top plate 1010 having vent 1012 therein, cooling element 1020, top chamber 1040, bottom chamber 1050, anchor 1060, and pedestal 1090 coupled to heat generating structure 1002 that are analogous to top plate 110 having vent 112 therein, cooling element 120', top chamber 140, bottom chamber 150, anchor 160, and pedestal 190 coupled to heat generating structure 102, respectively. Cooling element 1020 is centrally supported by anchor 1060 such that at least a portion of the perimeter of cooling element 1020 is free to vibrate. In some embodiments, anchor 1060 extends along the axis of cooling element 1020 (i.e. perpendicular to the plane of the page). In other embodiments, anchor 1060 is only near the center portion of cooling element 1020. Although not explicitly labeled, cooling element 1020 includes an anchored region coupled to anchor 1060 and cantilevered arms 1023 (of which only one is labeled). Although not labeled, the cantilevered arms 1023 include step regions, extension regions and outer regions analogous to anchored region 122, cantilevered arms 123, step region 124, extension region 126 and outer region 128 of cooling element 120'. In some embodiments, cantilevered arms 1023 of cooling element 1020 are driven in-phase. In some embodiments, cantilevered arms 1023 of cooling element 1020 are driven out-of-phase. In some embodiments, another cooling element, such as a simple cooling element 120, may be used.

Figure 10A:
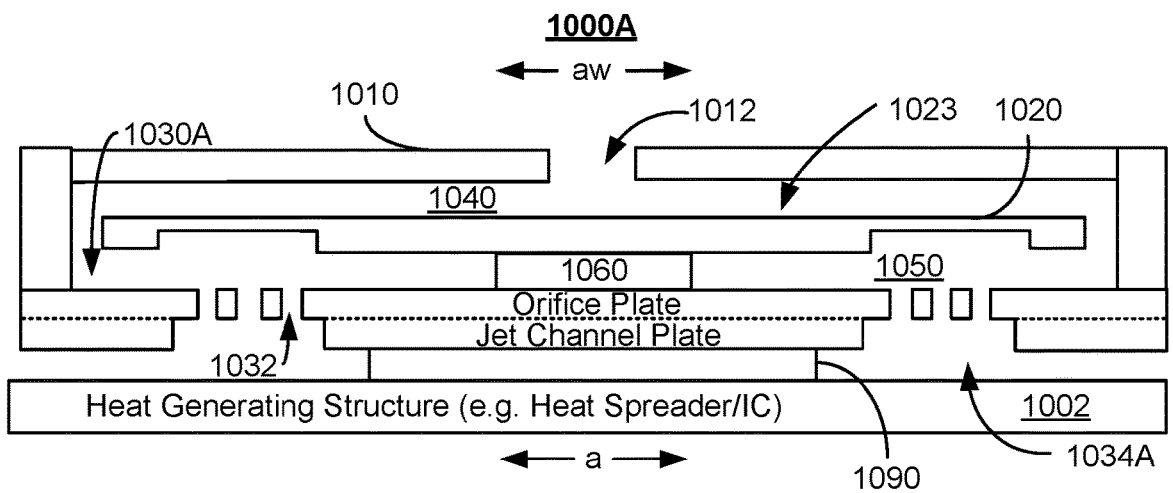
FIGS. 10A-10D depict embodiments of an active MEMS cooling system having an anchor that undergoes rotational motion.

Referring to FIG. 10A, cooling system 1000A also includes bottom plate 1030A having orifices 1032 therein that are analogous to bottom plate 130 and orifices 132. Bottom plate 1030A also includes cavities 1034A. Bottom plate 1030A may thus be considered to include an orifice plate analogous to orifice plate 130, which has orifices 132, and an additional jet channel plate that has cavities 1034A. The possible separation between such an orifice plate and a jet channel plate is shown by dotted lines in FIG. 10A.

Cooling system 1000A may be configured to enhance rotational motion of anchor 1060. In some embodiments, this is achieved by reducing the width, a, of anchor 1060. For example, anchor 1060 may have a width of at least 1.5 millimeters and not more than 2 millimeters in some embodiments. Because anchor 1060 is narrower, anchor 1060 may have reduced resistance against rotation. In some embodiments, bottom plate 1030A is configured to be compliant. Thus, bottom plate 1030A may also be configured to have low internal losses. Thus, the materials used in bottom plate 1030A may have low internal losses. The low internal losses include losses of not more than 0.1 percent losses. For example, the material(s) used that have low internal losses and are compliant may include at least one of Al7075, Al6063, Ti64, Ti Grade 2, Ti Grade 9, a beryllium-copper alloy, Monel, aluminum bronze, aluminum bronze, and aluminum, SUS304, and/or SUS316. Bottom plate 1030A is also desired to be thermally conductive. In some embodiments, higher density materials such as beryllium copper, may be desired to be used for bottom late 1030A. The use of compliant materials may also facilitate rotation of anchor 1060. Thus, rotation of anchor 1060 may be enhanced.

Figure 10B:
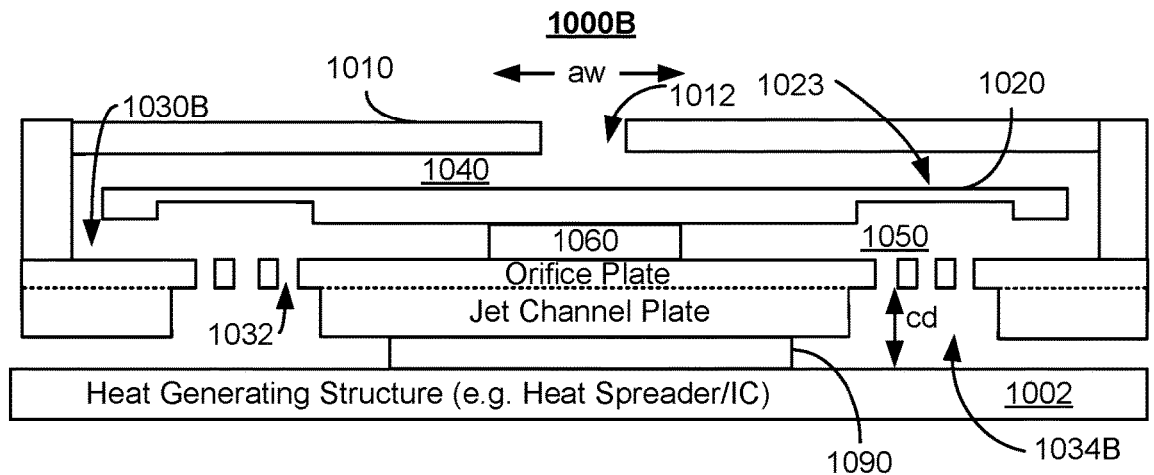

Referring to FIG. 10B, cooling system 1000B also includes bottom plate 1030B having orifices 1032 therein that are analogous to bottom plate 130 and orifices 132. Bottom plate 1030B also includes cavities 1034B. Bottom plate 1030B may thus be considered to include an orifice plate analogous to orifice plate 130, which has orifices 132, and an additional jet channel plate that has cavities 1034B. The possible separation between such an orifice plate and a jet channel plate is shown by dotted lines in FIG. 10B. Anchor 1060 of cooling system 1000B is shown as having a reduced width as in cooling system 1000A. However, other widths are possible.

Cooling system 1000B may be configured to enhance rotational motion of anchor 1060. In some embodiments, this is achieved by increasing the depth of cavities 1034B. For example, each cavity 1034B may have a depth, cd, that is at least forty percent and not more than ninety-five percent of the thickness, t1, of bottom plate 1030B. In some such embodiments, cavity 1034B has a depth, cd, that is at least fifty percent and not more than ninety percent of the thickness of bottom plate 1030B. Increasing the depth of cavities 1034B allows the central portion of bottom plate 1030 to have reduced resistance against rotation of anchor 1060. In some embodiments, bottom plate 1030B is configured to be compliant. Bottom plate 1030B may also be configured to have low internal losses. Thus, the materials used in bottom plate 1030B may be analogous for those used in bottom plate 1030A. The use of such materials may also facilitate rotation of anchor 1060. Rotation of anchor 1060 may, therefore, be enhanced.

Figure 10C:
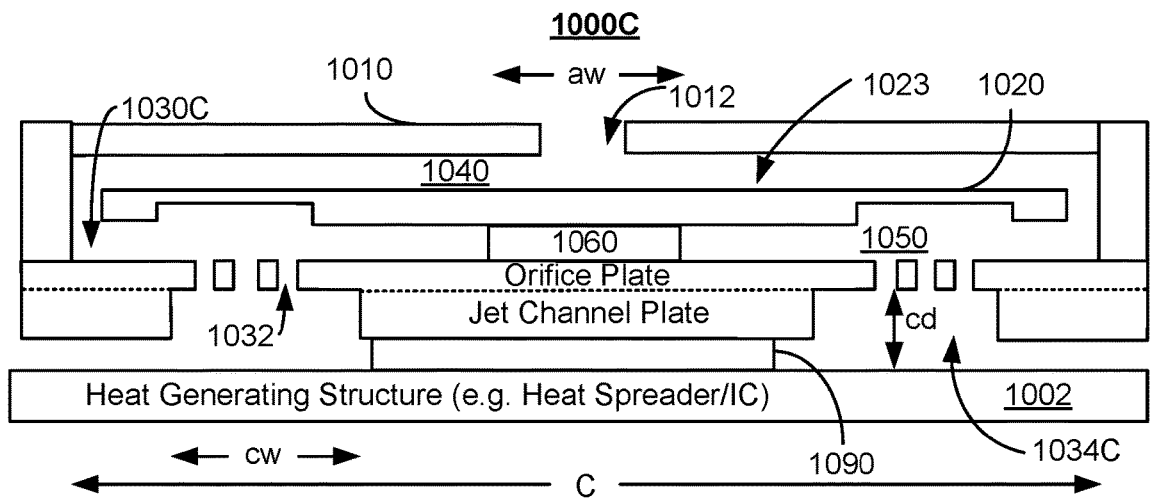

Referring to FIG. 10C, cooling system 1000C also includes bottom plate 1030C having orifices 1032 therein that are analogous to bottom plate 130 and orifices 132. Bottom plate 1030C also includes cavities 1034C. Bottom plate 1030C may thus be considered to include an orifice plate analogous to orifice plate 130, which has orifices 132, and an additional jet channel plate that has cavities 1034C. The possible separation between such an orifice plate and a jet channel plate is shown by dotted lines in FIG. 10C. Anchor 1060 of cooling system 1000C is shown as having a reduced width as in cooling system 1000A. However, other widths are possible. Similarly, cavity 1034C is shown as having an increased depth, cd. However other depths are possible.

Cooling system 1000C may be configured to enhance rotational motion of anchor 1060. In some embodiments, this is achieved by increasing the width, cw, of cavities 1034C. For example, each cavity 1034C may have a width that is at least one-tenth and not more than three-eighths of the cooling cell width, C. For example, cavity 1034C may have a width that is at least one-eighth and not more than three-eighths of the cooling cell width, C. Increasing the width of cavities 1034C reduces the resistance of bottom plate 1030C to rotations of anchor 1060. In some embodiments, bottom plate 1030C is configured to be compliant. Thus, bottom plate 1030C may also be configured to have low internal losses. Thus, the materials used in bottom plate 1030C may be analogous for those used in bottom plate 1030A. The use of such materials may also facilitate rotation of anchor 1060. Rotation of anchor 1060 may, therefore, be enhanced.

Figure 10D:
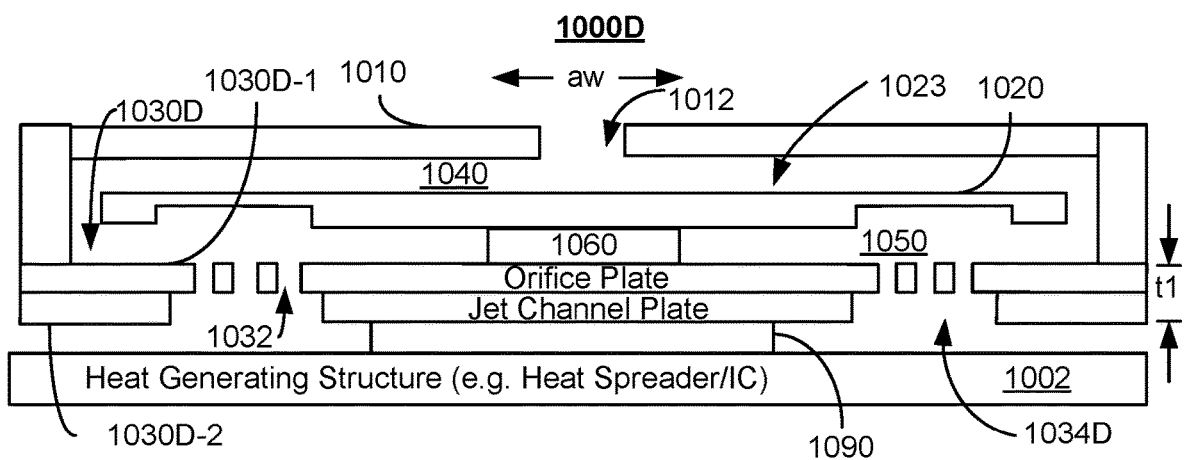

Referring to FIG. 10D, cooling system 1000D also includes bottom plate 1030D having orifices 1032 therein that are analogous to bottom plate 130 and orifices 132. Bottom plate 1030D also includes cavities 1034D. Anchor 1060 of cooling system 1000D is shown as having a reduced width as in cooling system 1000A. However, other widths are possible.

Bottom plate 1030D has been separated into separate orifice plate 1030D-1 and jet channel plate 1030D-2. Orifice plate 1030D-1 is analogous to orifice plate 130, which has orifices 132. Jet channel plate 1030D-2 has cavities 1034D. In some embodiments, orifice plate 1030D-1 and jet channel plate 1030D-2 may be joined into an integrated bottom plate.

Cooling system 1000C may be configured to enhance rotational motion of anchor 1060. In some embodiments, this is achieved by decreasing the thickness, t1, of bottom plate 1030D. For example, bottom plate 1030D may have a thickness of at least 0.4 millimeters and not more than 2 millimeters. In some embodiments, bottom plate 1030D has a thickness of at least 0.5 millimeters and not more than 1.5 millimeters. In some such embodiments, bottom plate 1030D has a thickness of at least 0.8 millimeters and not more than 1.2 millimeters. For example, bottom plate 1030D may be nominally one millimeter thick. Decreasing the thickness of bottom plate 1030D reduces the resistance of bottom plate 1030D to rotations of anchor 1060. In some embodiments, bottom plate 1030D is configured to be compliant. In such embodiments, bottom plate 1030D may also be configured to have low internal losses. Thus, the materials used in bottom plate 1030D may be analogous for those used in bottom plate 1030A. The use of such materials may also facilitate rotation of anchor 1060. Rotation of anchor 1060 may, therefore, be enhanced.

Various techniques for increasing the ability of anchor 1060 to undergo rotation have been described. Some or all of these techniques may be combined with each other and/or other techniques in manners not explicitly described.

Cooling systems 1000A, 1000B, 1000C, and 1000D operate in an analogous manner to cooling systems 100, 400, 500, 600, 700, and 800. Cooling systems 1000A, 1000B, 1000C, and/or 1000D thus share the benefits of cooling systems 100, 400, 500, 600, 700, and/or 800. Thus, performance of a device employing cooling systems 1000A, 1000B, 1000C, and/or 1000D may be improved. Further, enhanced rotation of anchor 1060 may improve the efficiency and reduce the losses. Thus, performance and reliability of cooling systems 1000A, 1000B, 1000C, and 1000D may be improved.

Figure 11:
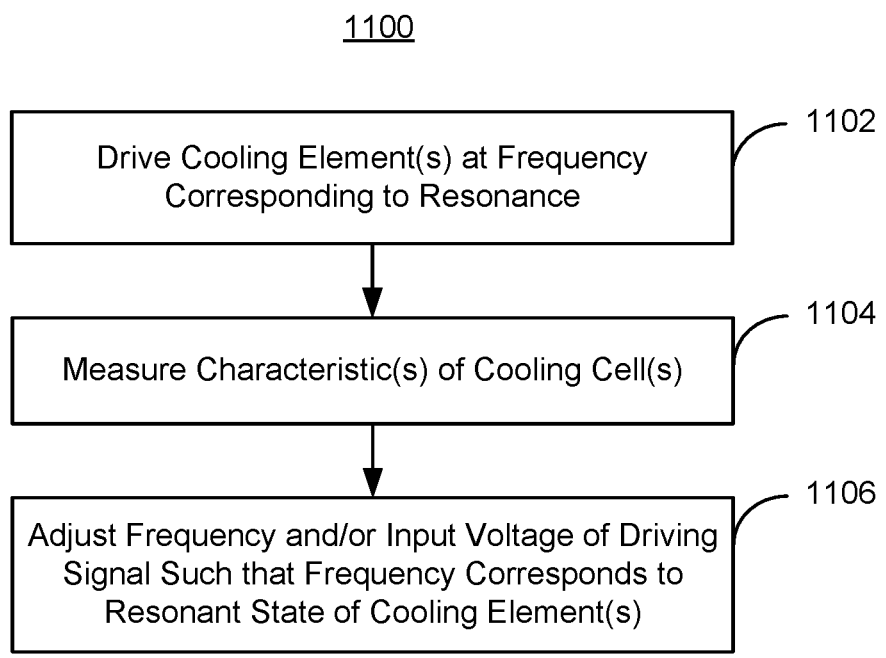
FIG. 11 depicts an embodiment of a method for using an active cooling mems system.

FIG. 11 depicts an embodiment of method 1100 for using an active cooling system. Method 1100 may include steps that are not depicted for simplicity. Method 1100 is described in the context of system 400. However, method 1100 may be used with other cooling systems including but not limited to systems and cells described herein.

A driving signal at a frequency and an input voltage corresponding to the resonant state of one or more cooling elements is provided to the active MEMS cooling system, at 1102. In some embodiments, a driving signal having the frequency corresponding to the resonant frequency of a specific cooling element is provided to that cooling element. In some embodiments, a driving signal is provided to multiple cooling elements. In such embodiments, the frequency of the driving signal corresponds to the resonant state of one or more cooling elements being driven, a statistical measure of the resonance, and/or within a threshold of the resonance as discussed above.

Characteristic(s) of the MEMS cooling system are monitored while the cooling element(s) are driven to provide a feedback signal corresponding to a proximity to a resonant state of the cooling element(s), at 1104. In some embodiments, characteristic(s) of each individual cooling element are monitored to determine the deviation of the frequency of vibration for that cooling element from the resonant frequency of that cooling element. In some embodiments, characteristic(s) for multiple cooling elements are monitored at 1104. The characteristic(s) monitored may be a proxy for resonance and/or a deviation therefrom. For example, the voltage at the cooling element, the power drawn by the cooling element, power output by the power source, peak-to-peak current output by the power source, peak voltage output by the power source, average current output by the power source, RMS current output by the power source, average voltage output by the power source, amplitude of displacement of the at least one cooling element, RMS current through the cooling element, peak voltage at the cooling element, average current through the cooling element, average voltage at the at least one cooling element, and/or the peak current drawn by the cooling element may be monitored. Using the characteristic(s) monitored, a deviation from the resonant state of the cooling element (e.g. deviation of the driving/vibration frequency from the resonant frequency) may be determined.

The frequency and/or input voltage is adjusted based on the feedback signal, at 1106. More specifically, 1106 includes updating the frequency and/or input voltage, based on the feedback signal, to correspond to resonant state(s) of the cooling element(s) at 1106. For example, the frequency for the drive signal may be updated to more closely match the resonant frequency/frequencies. In some embodiments, updating the frequency includes changing the frequency to correspond to a power drawn corresponding to the vibration of the cooling element(s) being maximized, a voltage provided at the cooling element(s) being maximized, a voltage across the cooling element(s) being minimized, and/or an amplitude of a current drawn by the at least one cooling element being minimized. In some embodiments, 1106 includes determining whether the feedback signal indicates that a drift in the resonant frequency of the cooling element(s) exceeds a threshold and identifying a new frequency in response to a determination that the drift exceeds the threshold. The new frequency accounts for the drift in the resonant frequency. The method also includes setting the new frequency as the frequency for the driving signal in response to the new frequency being identified.

For example, cooling element 420 or 1020 in MEMS cooling system 400 or 1000D is driven, at 1102. Thus, the cooling element 420 or 1020 is driven at a frequency that is at or near resonance for one or more of the cooling elements. Characteristics of cooling element 420 or 1020 within MEMS cooling system 400 or 1000D are monitored, at 1104. Thus, the drift of the cooling element(s) 420 and/or 1020 from resonance may be determined. The frequency may be adjusted based on the monitoring of 1104, at 1106. Thus, MEMS cooling system 400 or 1000D may be kept at or near resonance.

Thus, using method 1100, an active cooling system, such as cooling system(s) 100, 200, 300, 400, 500, 600, 700, 800, 900, 1000A, 1000B, 1000C, and/or 1000D may be efficiently driven. These cooling systems are also configured for improved alignment, symmetry, efficiency, and/or reliability. Thus, method 1100 may be used to operate active MEMS cooling systems and achieve the benefits described herein.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A cooling system, comprising:
   a bottom plate having a plurality of orifices therein;
   a support structure;
   a cooling element having a central axis, the cooling element being supported by the support structure at the central axis such that a first portion of the cooling element on a first side of the central axis and a second portion of the cooling element on a second side of the central axis opposite to the first side are unpinned, the first portion and the second portion being configured to undergo vibrational motion when actuated to drive a fluid toward a heat-generating structure, the support structure coupling the cooling element to the bottom plate; and
   wherein at least one of the support structure is an adhesive support structure or the support structure undergoes rotational motion in response to the vibrational motion, the adhesive support structure having at least one lateral dimension defined by a trench in the cooling element or the bottom plate,
   wherein the support structure is the adhesive support structure and the cooling element includes the trench defining a first support structure width; and wherein the bottom plate includes an additional trench defining a second support structure width, the second support structure width being different from the first support structure width.

2. The cooling system of claim 1, wherein the cooling element includes a material having a high acoustic velocity and low internal losses.

3. The cooling system of claim 2, wherein the high acoustic velocity is greater than four thousand meters per second and the low internal losses is not more than 0.1 percent.

4. The cooling system of claim 2, wherein the material includes at least one of Al7075, Al6063, Ti64, Ti Grade 2, Ti Grade 9, a beryllium-copper alloy, Monel, aluminum bronze, aluminum, SUS 304, or SUS316.

5. The cooling system of claim 1, wherein the bottom plate includes a cavity therein, the bottom plate having a thickness, the cavity having a depth and a cavity width, the support structure having an anchor width, and the bottom plate including a material, at least one of the depth, anchor width, thickness, or material being configured to increase the rotational motion of the support structure.

6. The cooling system of claim 5, wherein the cooling element, the support structure and the bottom plate are part of a cooling cell having a cooling cell width, wherein at least one of the anchor width is not more than two millimeters, the depth of the cavity is at least fifty percent and not more than ninety percent of the thickness, the cavity width is at least one-eighth and not more than three-eighths of the cooling cell width, or the material includes at least one of Al7075, Al6063, Ti64, Ti Grade 2, Ti Grade 9, a beryllium-copper alloy, Monel, aluminum bronze, aluminum, SUS304, or SUS316.

7. The cooling system of claim 5, wherein the bottom plate includes an orifice plate and a jet channel plate, the orifice plate including the plurality of orifices therein, the jet channel plate including the cavity therein.

8. The cooling element of claim 1, wherein at least one of the bottom plate or the cooling element includes a support structure region aligned with and coupled to the support structure, the support structure region having a surface including at least one tortuous path defined thereon.

9. The cooling system of claim 1, wherein the adhesive support structure has a Young's modulus of greater than two GPa.

10. A cooling system, comprising:
a plurality of cooling cells, each of the plurality of cooling cells including a bottom plate having a plurality of orifices therein, a support structure and a cooling element, the cooling element having a central axis, the cooling element being supported by the support structure at the central axis such that a first portion of the cooling element on a first side of the central axis and a second portion of the cooling element on a second side of the central axis opposite to the first side are unpinned, the first portion and the second portion configured to undergo vibrational motion when actuated to drive a fluid toward a heat-generating structure, the support structure coupling the cooling element to the bottom plate; and
wherein at least one of the support structure is an adhesive support structure or the support structure undergoes rotational motion in response to the vibrational motion, the adhesive support structure having at least one lateral dimension defined by a trench in the cooling element or the bottom plate,
wherein the support structure is the adhesive support structure and the cooling element includes the trench defining a first support structure width; and wherein the bottom plate includes an additional trench defining a second support structure width, the second support structure width being different from the first support structure width.

11. The cooling system of claim 10, wherein the cooling element includes a material having a high acoustic velocity and low internal losses.

12. The cooling system of claim 11, wherein the high acoustic velocity is greater than four thousand meters per second and the low internal losses is not more than 0.1 percent.

13. The cooling system of claim 11, wherein the material includes at least one of Al7075, Al6063, Ti64, Ti Grade 2, Ti Grade 9, a beryllium-copper alloy, Monel, aluminum bronze, aluminum, SUS304, or SUS316.

14. The cooling system of claim 10, wherein the bottom plate includes a cavity therein, the bottom plate having a thickness, the cavity having a depth and a cavity width, the support structure having an anchor width, and the bottom plate including a material, at least one of the depth, anchor width, thickness, or material being configured to increase the rotational motion of the support structure.

15. The cooling system of claim 14, wherein the cooling element, the support structure and the bottom plate are part of a cooling cell having a cooling cell width, wherein at least one of the anchor width is not more than two millimeters, the depth of the cavity is at least fifty percent and not more than ninety percent of the thickness, the cavity width is at least one-eighth and not more than three-eighths of the cooling cell width, or the material includes at least one of Al7075, Al6063, Ti64, Ti Grade 2, Ti Grade 9, a beryllium-copper alloy, Monel, aluminum bronze, or aluminum, SUS304, or SUS316.

16. The cooling system of claim 14, wherein the bottom plate includes an orifice plate and a jet channel plate, the orifice plate including the plurality of orifices therein, the jet channel plate including the cavity therein.

17. The cooling element of claim 10, wherein the support structure is the adhesive support structure and the cooling element includes the trench defining a first support structure width; and
wherein the bottom plate includes an additional trench defining a second support structure width, the second support structure width being different from the first support structure width.

18. The cooling element of claim 10, wherein at least one of the bottom plate or the cooling element includes a support structure region aligned with and coupled to the support structure, the support structure region having a surface including at least one tortuous path defined thereon.

19. A method of cooling a heat-generating structure, comprising: driving a cooling element to induce a vibrational motion at a frequency, the cooling element being part of a cooling cell, the cooling cell including a bottom plate having a plurality of orifices therein, a support structure, the cooling element having a central axis, the cooling element being supported by the support structure at the central axis such that a first portion of the cooling element on a first side of the central axis and a second portion of the cooling element on a second side of the central axis opposite to the first side are unpinned, the first portion and the second portion being configured to undergo vibrational motion when actuated to drive a fluid toward the heat-generating structure, the support structure coupling the cooling element to the bottom plate, at least one of the support structure being an adhesive support structure or the support structure undergoes rotational motion in response to the vibrational motion, the adhesive support structure having at least one lateral dimension defined by a trench in the cooling element or the bottom plate, wherein the support structure is the adhesive support structure and the cooling element includes the trench defining a first support structure width; and wherein the bottom plate includes an additional trench defining a second support structure width, the second support structure width being different from the first support structure width.

* * * * *